(12) United States Patent  
Hwu et al.

(10) Patent No.: US 12,402,334 B2  
(45) Date of Patent: Aug. 26, 2025

(54) INTEGRATED CIRCUIT DEVICE AND METHOD FOR FABRICATING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei (TW); Jian-Yu Lin, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 415 days.

(21) Appl. No.: 17/580,536

(22) Filed: Jan. 20, 2022

(65) Prior Publication Data

US 2023/0231031 A1 Jul. 20, 2023

(51) Int. Cl.
| | |
|---|---|
| *H10D 8/01* | (2025.01) |
| *H10D 1/66* | (2025.01) |
| *H10D 8/70* | (2025.01) |
| *H10D 30/01* | (2025.01) |
| *H10D 30/62* | (2025.01) |
| *H10D 62/10* | (2025.01) |
| *H10D 84/83* | (2025.01) |

(52) U.S. Cl.
CPC ............... *H10D 8/053* (2025.01); *H10D 1/66* (2025.01); *H10D 8/70* (2025.01); *H10D 30/024* (2025.01); *H10D 30/6211* (2025.01); *H10D 62/115* (2025.01); *H10D 84/834* (2025.01)

(58) Field of Classification Search
CPC ......... H01L 29/66151; H01L 29/66795; H01L 29/88; H01L 27/0886; H01L 29/94; H10D 8/053; H10D 8/70; H10D 1/66; H10D 30/024; H10D 30/6211; H10D 62/115; H10D 84/834
See application file for complete search history.

(56) References Cited

U.S. PATENT DOCUMENTS

| | | | |
|---|---|---|---|
| 2020/0098900 A1* | 3/2020 | Hwu | H01L 29/423 |
| 2020/0098901 A1* | 3/2020 | Hwu | H01L 29/513 |
| 2021/0057488 A1* | 2/2021 | Hwu | H10B 63/30 |

(Continued)

OTHER PUBLICATIONS

Jong-Ho Bae et al., "Characterization of a Capacitorless DRAM Cell for Cryogenic Memory Applications", IEEE Electron Device Letters, vol. 40, No. 10, Oct. 2019, pp. 1614-1617.

(Continued)

*Primary Examiner* — Britt D Hanley  
*Assistant Examiner* — Casey Paul Boatman  
(74) *Attorney, Agent, or Firm* — Maschoff Brennan

(57) ABSTRACT

An integrated circuit device includes a semiconductor structure, a tunneling layer, a top electrode, a passivation layer, and a conductive feature. The semiconductor structure has a base portion and a protruding portion over a top surface of the base portion. The tunneling layer is over a top surface of the protruding portion of the semiconductor structure. The top electrode is over the tunneling layer. The passivation layer is over a sidewall of the protruding portion of the semiconductor structure. The conductive feature is directly below the protruding portion of the semiconductor structure.

20 Claims, 44 Drawing Sheets

(56) References Cited

U.S. PATENT DOCUMENTS

2021/0202484 A1* 7/2021 Hwu ............... H10D 30/696
2021/0288048 A1* 9/2021 Chuang ........... H01L 21/823462

OTHER PUBLICATIONS

Saisai Wang et al., "Physically Transient W/ZnO/MgO/W Schottky Diode for Rectifying and Artificial Synapse", IEEE Electron Device Letters, vol. 41, No. 6, Jun. 2020, pp. 844-847.

Jyi-Tsong Lin et al., " A New Electron Bridge Channel 1T-DRAM Employing Underlap Region Charge Storage", IEEE Journal of the Electron Devices Society, vol. 5, No. 1, Jan. 2017, pp. 59-63.

Hyungjin Kim et al., "Asymmetric dual-gate-structured one-transistor dynamic random access memory cells for retention characteristics improvement", Applied Physics Express, vol. 9, Jul. 2016, pp. 084201-1-084201-4.

Hasan Raza Ansari et al., "Capacitorless 2T-DRAM for Higher Retention Time and Sense Margin", IEEE Transactions on Electron Devices, vol. 67, No. 3, Mar. 2020, pp. 902-906.

Santiago Navarro et al., "Reliability Study of Thin-Oxide Zero-Ionization, Zero-Swing Fet 1T-DRAM Memory Cell", IEEE Electron Device Letters, vol. 40, No. 7, Jul. 2019, pp. 1084-1087.

Tzu-Yu Chen et al., "Effect of Electrons Trapping/De-Trapping at Si-SiO2 Interface on Two-State Current in MOS(p) Structure with Ultra-Thin SiO2 by Anodization", ECS Journal of Solid State Science and Technology, vol. 2, No. 9, Jul. 2013, pp. Q159-Q164.

Jian-Yu Lin et al., "Enhanced Transient Behavior in MIS(p) Tunnel Diodes by Trench Forming at the Gate Edge", IEEE Transactions on Electron Devices, vol. 68, No. 9, Sep. 2021, pp. 4189-4194.

Yen-Kai Lin et al., "Photosensing by Edge Schottky Barrier Height Modulation Induced by Lateral Diffusion Current in MOS(p) Photodiode," IEEE Transactions on Electron Devices, vol. 61, No. 9, Sep. 2014, pp. 3217-3222.

\* cited by examiner

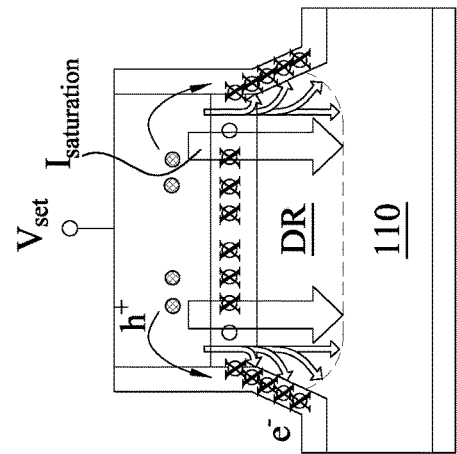
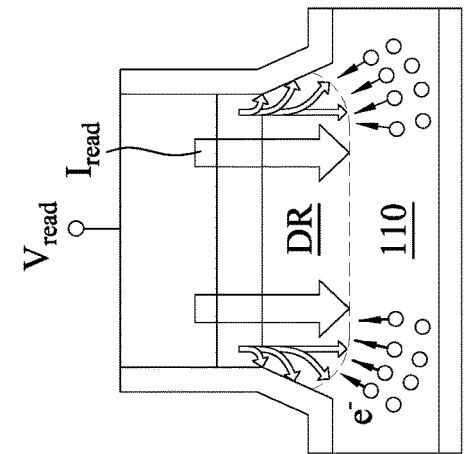
Fig. 3A
Fig. 3D
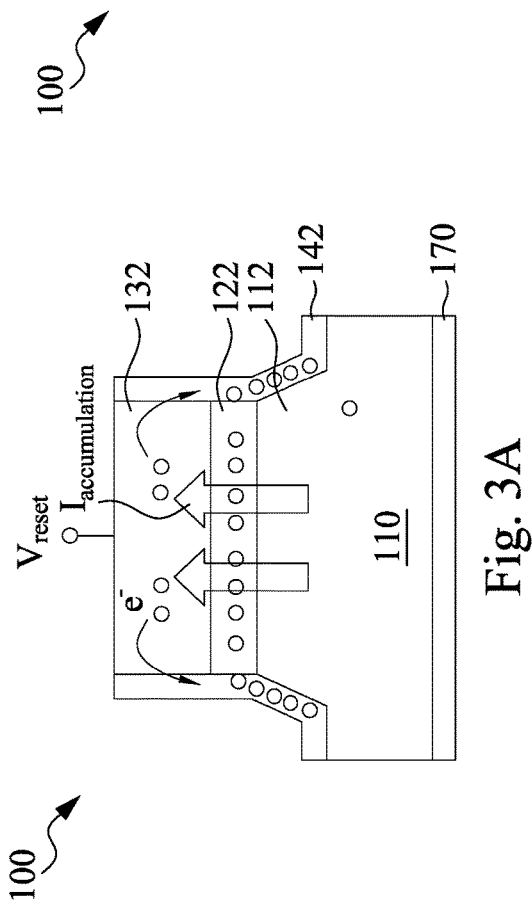
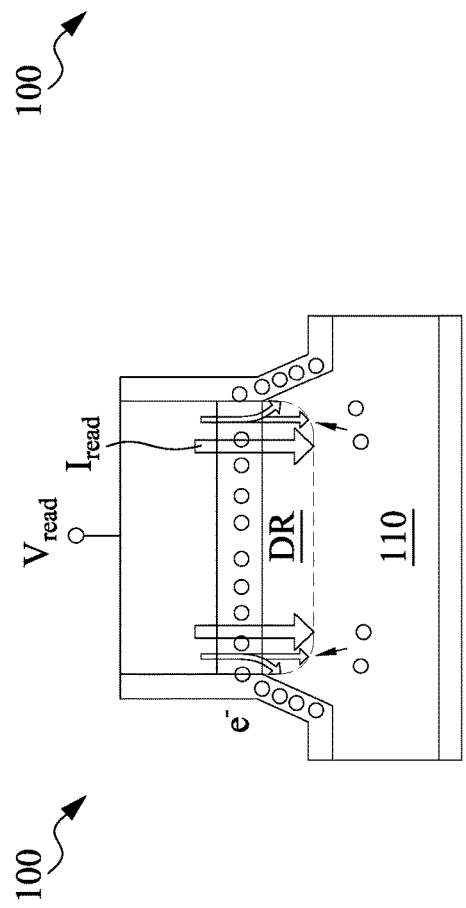
Fig. 3A
Fig. 3B

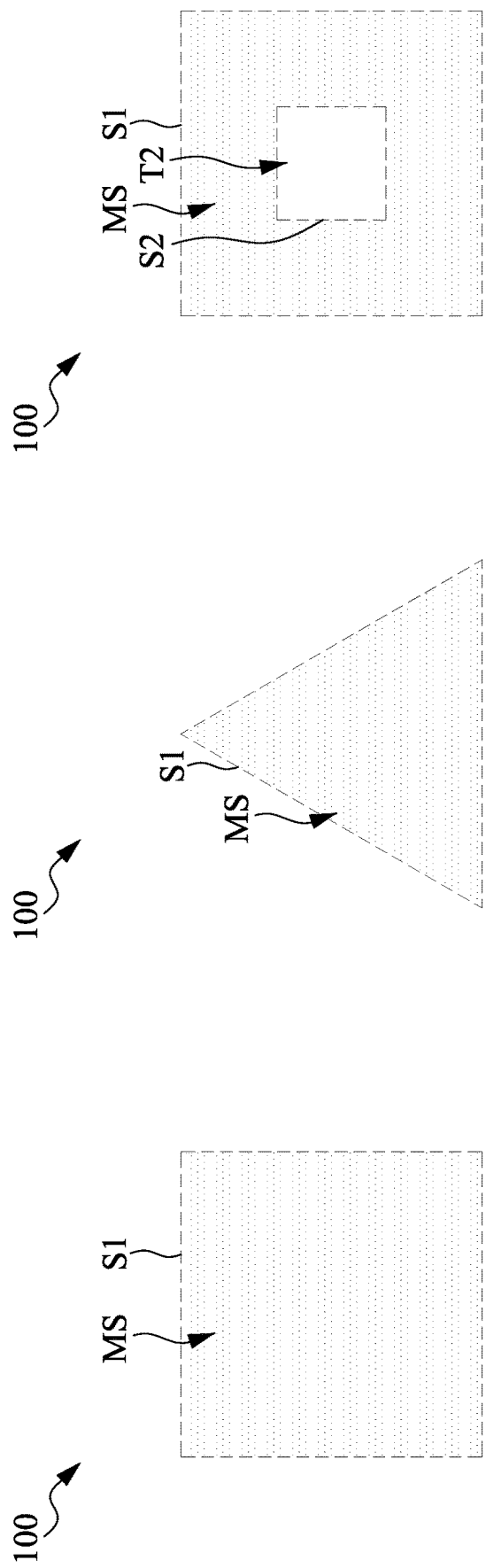

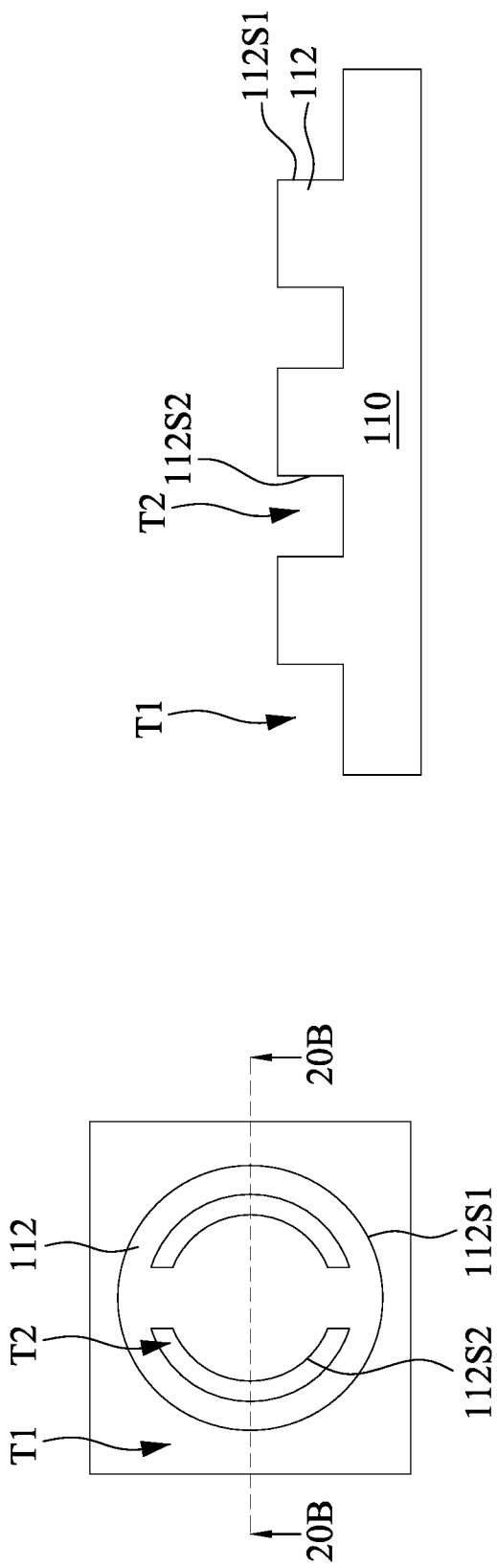

INTEGRATED CIRCUIT DEVICE AND METHOD FOR FABRICATING THE SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Memory devices are one type of the semiconductor devices being adapted to store digital information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D illustrate a MIS TD device at a reset operation, a set operation, and read operations for the stress-setting method in FIG. 2.

FIGS. 15A-15C illustrate top views of gate electrodes of various trench-type MIS TD devices in accordance with some embodiments of the present disclosure.

FIGS. 20A-22 illustrate a method for fabricating a trench-type MIS TD device at various stages in accordance with some embodiments of the present disclosure.

DETAILED DESCRIPTION

Figure 1B:
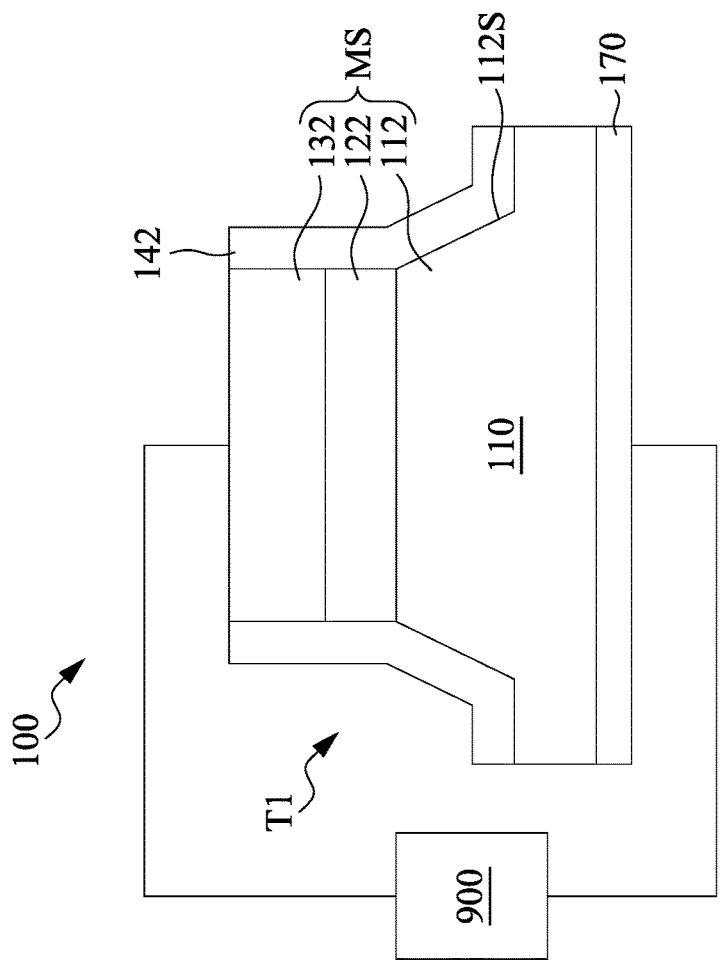
FIG. 1B is a cross sectional view taken along line 1B-1B in FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may mean within 20 percent, or within 10 percent, or within 5 percent of a given value or range. Numerical quantities given herein are approximate, meaning that the term "around," "about," "approximately," or "substantially" can be inferred if not expressly stated.

Metal-insulator-semiconductor (MIS) tunneling diode (TD) devices can be designed with edge trench structures for increasing edge charge trapping sites, which can change reverse bias currents of the devices and enlarge memory windows of the devices. The trench-type MIS TD devices and method of fabricating the same are provided in accordance with various embodiments. The intermediate stages of forming the trench-type MIS TD devices are illustrated. The variations and the operation of the embodiments are discussed.

Figure 1A:
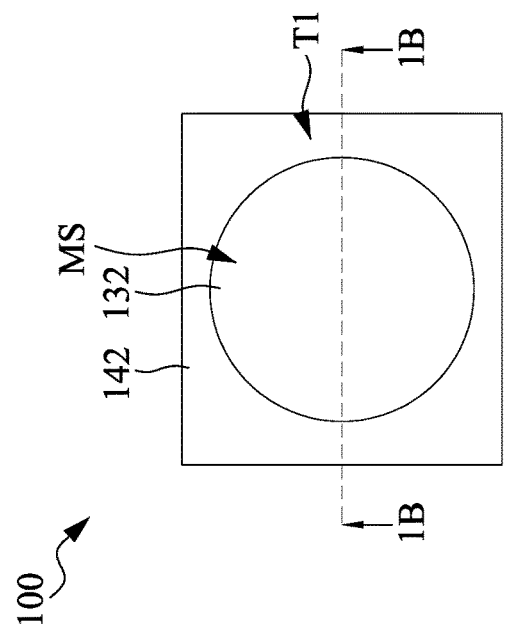
FIG. 1A is a top view of a metal-insulator-semiconductor (MIS) tunneling diode (TD) device in accordance with some embodiments of the present disclosure.

FIG. 1A is a top view of a trench-type MIS TD device 100 in accordance with some embodiments of the present disclosure. FIG. 1B is a cross sectional view taken along line 1B-1B in FIG. 1A. The device 100 may include a stack MS over a semiconductor substrate 110, a passivation layer 142 surrounding the stack MS, and a bottom electrode 170 below the stack MS. The stack MS can be referred to as a MIS structure. For example, the stack MS include a semiconductor protruding portion 112, a tunneling layer 122, and a gate electrode 132. The stack MS is surrounded by a trench T1, and the passivation layer 142 may extend along sidewalls and a bottom the trench T1. The tunneling layer 122 and the passivation layer 142 may be made of suitable charge trapping materials, which is non-conductive but contains a large number of charge trapping sites able to hold an electrostatic charge.

The gate electrode 132 and the bottom electrode 170 of the device 100 may be connected to a controller circuit 900. The controller circuit 900 is configured to apply various voltage biases across the device 100 to change the resistive states of the device 100 by charging or discharging the tunneling layer 122 and the passivation layer 142. In some embodiments, the controller circuit 900 is configured to perform a reset operation on the device 100 to charge the tunneling layer 122 and the passivation layer 142, thereby changing the device 100 from a low resistive state to a high resistive state. In some embodiments, the controller circuit 900 is configured to perform a set operation on the device 100 to discharge the tunneling layer 122 and the passivation layer 142, thereby changing the device 100 from a high resistive state to a low resistive state. The controller circuit 900 may include electronic memory and one or more electronic processors configured to execute programming instructions stored in the electronic memory. In some embodiments, the controller circuit 900 may include processors, central processing units (CPU), multi-processors, distributed processing systems, application specific integrated circuits (ASIC), or the like.

In some embodiments of the present disclosure, by the configuration of the trench T1 and the passivation layer 142, a number of the charge trapping sites is disposed at trench edges of the device 100. For example, the charge trapping sites exist adjacent the semiconductor protruding portion 112 but not directly between the gate electrode 132 and the semiconductor protruding portion 112. These charge trapping sites have an influence on reverse bias current of the device 100, and may maximize a current window of the device 100 to better distinguish between high resistive reset states corresponding to a first data value (e.g., a logical '0') and low resistive set states corresponding to a second data value (e.g., a logical '1').

A thickness of the tunneling layer 122 may be tuned according to the memory operation method. For a stress-setting method in FIG. 2, a thickness of the tunneling layer 122 is in a range from about 0.5 nanometers to about 3 nanometers. If the thickness of the tunneling layer 122 is less than about 0.5 nanometers, a reverse bias current may become too small, which may degrade memory performance. If the thickness of the tunneling layer 122 is greater than about 3 nanometers, it may unnecessarily increase the time duration for reset and set operations. For other kinds of the memory operation method (e.g., a switching-pulse-setting method in FIG. 38), a thickness of the tunneling layer 122 (referring to FIG. 1B) may be greater than about 3 nanometers, for example, in a range from about 3 nanometers to about 4 nanometers. For the switching-pulse-setting method in FIG. 38, if the thickness of the tunneling layer 122 is less than about 3 nanometers, the data retention of the device may become poor. For the switching-pulse-setting method in FIG. 38, if the thickness of the tunneling layer 122 is greater than about 4 nanometers, current may not flow through the tunneling layer 122.

In some embodiments, the protruding portion 112 may have a sidewall 112S that slants with respect to a direction normal to the substrate 110. The passivation layer 142 may cover he slanted sidewall 112S of the protruding portion 112. In some other embodiments, the sidewall 112S of the protruding portion 112 may be a vertical to the direction normal to the substrate 110.

Figure 2:
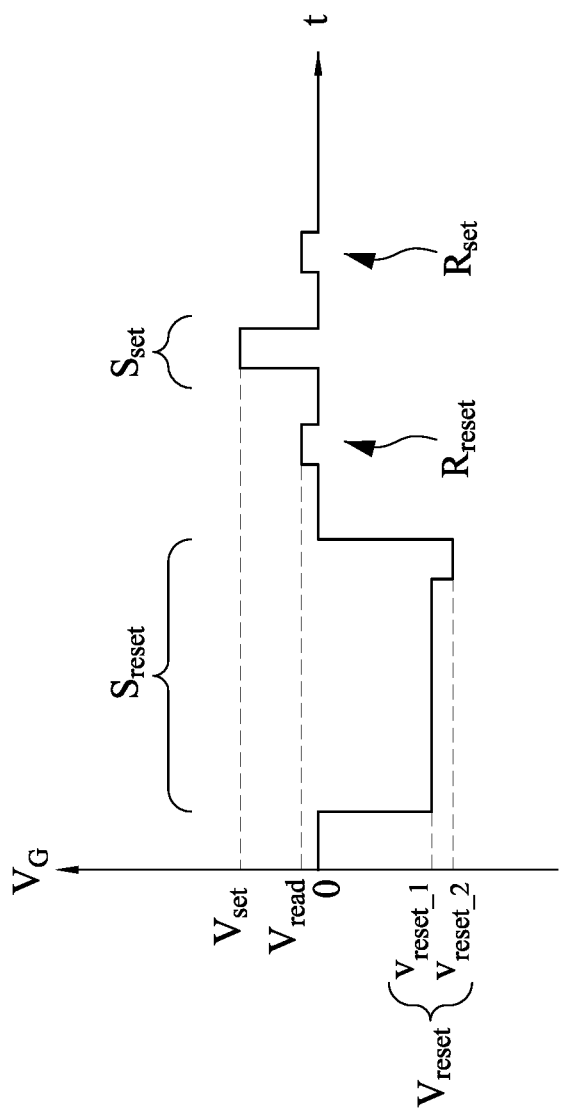
FIG. 2 is a timing diagram illustrating a stress-setting method of performing a reset operation, a read operation, a set operation, and a read operation on a MIS TD device in accordance with some embodiments of the present disclosure.

FIG. 2 is a timing diagram illustrating a stress-setting method of performing a reset operation $S_{reset}$, a read operation $R_{reset}$, a set operation $S_{set}$, and a read operation $R_{set}$ on a MIS TD device in accordance with some embodiments of the present disclosure. In FIG. 2, a time is shown on the horizontal axis, a gate bias voltage $V_G$ is shown on the vertical axis. Referring to FIGS. 1B and 2, the controller circuit 900 in FIG. 1B may provide the signals in FIG. 2 to the gate electrode 132, and a reference potential (e.g., a ground potential) to the bottom electrode 170. The reset signal of the reset operation $S_{reset}$ may include one or more reset voltages $V_{reset}$ for suitable reset time durations. For example, the reset signal of the reset operation $S_{reset}$ includes as a first reset voltage $V_{reset\_1}$ for a first reset time duration followed by a second reset voltage $V_{reset\_2}$ for a second reset time duration. The reset voltages $V_{reset}$ (e.g., the voltage $V_{reset\_1}$ and $V_{reset\_2}$) may be in a range from about −0.4 Volts to about −4 Volts. A sum of the first and second reset time durations may be in a range from about 1 nanosecond to about 300 seconds. In some embodiments, a magnitude of the second reset voltage $V_{reset\_2}$ may be greater than a magnitude of the first reset voltage $V_{reset\_1}$, and the first reset time duration may be greater than the second reset time duration. For example, the first reset voltage $V_{reset\_1}$ may be in a range from about −1.4 Volts to about −1.6 Volts, the first reset time duration may be in a range from about 100 seconds to about 140 seconds, the second reset voltage $V_{reset\_2}$ may be in a range from about −1.65 Volts to about −1.85 Volts, the second reset time duration may be in a range from about 10 seconds to about 30 seconds. In some other embodiments, the reset signal of the reset operation $S_{reset}$ may include the second reset voltage $V_{reset\_2}$ for the second reset time duration, while the first reset voltage $V_{reset\_1}$ for the first reset time duration is omitted. The reading voltage $V_{read}$ may be in a range from about 0.1 Volts to about 0.3 Volts. The set signal of the set operation $S_{set}$ may include a set voltage $V_{set}$ for a suitable set time duration. For example, the set voltage $V_{set}$ may be in a range from about 0.01 Volts to about 20 Volts, for example, from about 0.5 Volts to about 1.5 Volts. The set time duration may be in a range from about 1 nanosecond to about 300 second, for example, from about 0.1 seconds to about 30 seconds. In FIG. 2, when the bottom electrode 170 (referring to FIG. 1B) is grounded, the reading voltage $V_{read}$ is positive, the set voltage $V_{set}$ is positive and greater than the reading voltage $V_{read}$, and the reset voltages are negative.

FIGS. 3A-3D illustrate a MIS TD device at the reset operation $S_{reset}$, the read operation $R_{reset}$, the set operation $S_{set}$, and the read operation $R_{set}$ for the stress-setting method in FIG. 2. In FIGS. 3A-3D, hollow arrows indicate magnitudes and directions of currents. In FIG. 3A, the device 100 is reset by providing a reset signal of the reset operation $S_{reset}$ (referring to FIG. 2) to the gate electrode 132. The reset signal of the reset operation $S_{reset}$ (referring to FIG. 2) may include a negative voltage $V_{reset}$ applied on the gate electrode 132. The negative voltage $V_{reset}$ causes a large number of electrons trapped and accumulating the tunneling layer 122 and the passivation layer 142. During the reset operation $S_{reset}$ (referring to FIG. 2), the device 100 may work in an accumulation region, and have a corresponding accumulation current $I_{accumulation}$.

In FIG. 3B, after the reset operation, the device 100 is read by applying a reading voltage $V_{read}$ (referring to FIG. 2) on the gate electrode 132. The reading voltage $V_{read}$ may provide positive charges (e.g., holes) to attract electrons in the substrate 110. The attracted electrons in the substrate 110 may recombine with the positive charges (e.g., holes), thereby creating a small depletion region DR directly below the tunneling layer 122. In some embodiments of the present embodiments, a small portion of the electrons trapped in the tunneling layer 122 may recombine with the positive charges (e.g., holes), while a large portion of the electrons trapped in the tunneling layer 122 and the electrons trapped in the passivation layer 142 remains. The large portion of the electrons trapped in the tunneling layer 122 may result in a low reading current $I_{read}$, and the electrons trapped in the passivation layer 142 may weaken fringing field effect, which further suppresses reading current $I_{read}$. In FIG. 3D, the device 100 may be at a high resistive reset state, which corresponds to a first data value (e.g., a logical '0').

In FIG. 3C, the device 100 is set by providing a set signal of the set operation $S_{set}$ (referring to FIG. 2) to the gate electrode 132. The set signal of the set operation $S_{set}$ (referring to FIG. 2) may include a positive set voltage $V_{set}$, greater than the reading voltage $V_{read}$ (referring to FIG. 2), applied on the gate electrode 132. The positive set voltage $V_{set}$ may provide positive charges (e.g., holes) to attract electrons in the substrate 110. The attracted electrons in the substrate 110 may recombine with the positive charges (e.g., holes), thereby creating a depletion region DR below the tunneling layer 122 and the passivation layer 142. As shown in FIG. 3C, the depletion region DR is deeper and wider than the depletion region DR in FIG. 3B. During the set operation $S_{set}$ (referring to FIG. 2), the device 100 may work in a saturation region and have a corresponding saturation current $I_{saturation}$. In some embodiments of the present embodiments, the electrons trapped in the tunneling layer 122 and the passivation layer 142 may fully recombine with the positive charges (e.g., holes), and leaving little or none electrons trapped in the tunneling layer 122 and the passivation layer 142 after the set operation $S_{set}$.

In FIG. 3D, after the set operation $S_{set}$ (referring to FIG. 2), the device 100 is read by applying a reading voltage $V_{read}$ (referring to FIG. 2) on the gate electrode 132. At this stage, the depletion region DR caused by the set operation $S_{set}$ (referring to FIG. 2) may be maintained. Since there are little or none electrons trapped in the tunneling layer 122 and the passivation layer 142 after the set operation $S_{set}$ (referring to FIG. 2), a reading current head in FIG. 3D may be larger than the reading current $I_{read}$ in FIG. 3B. In FIG. 3D, the device 100 may be at a low resistive set state, which corresponds to a second data value (e.g., a logical '1').

In some embodiments of the present disclosure, since the extra electrons trapped at shallow trench edge may largely suppress the reading current $I_{read}$, a large current window (e.g., a difference between reading currents $I_{read}$ after set and reset operations $S_{set}$ and $S_{reset}$) can be achieved.

Figure 3E:
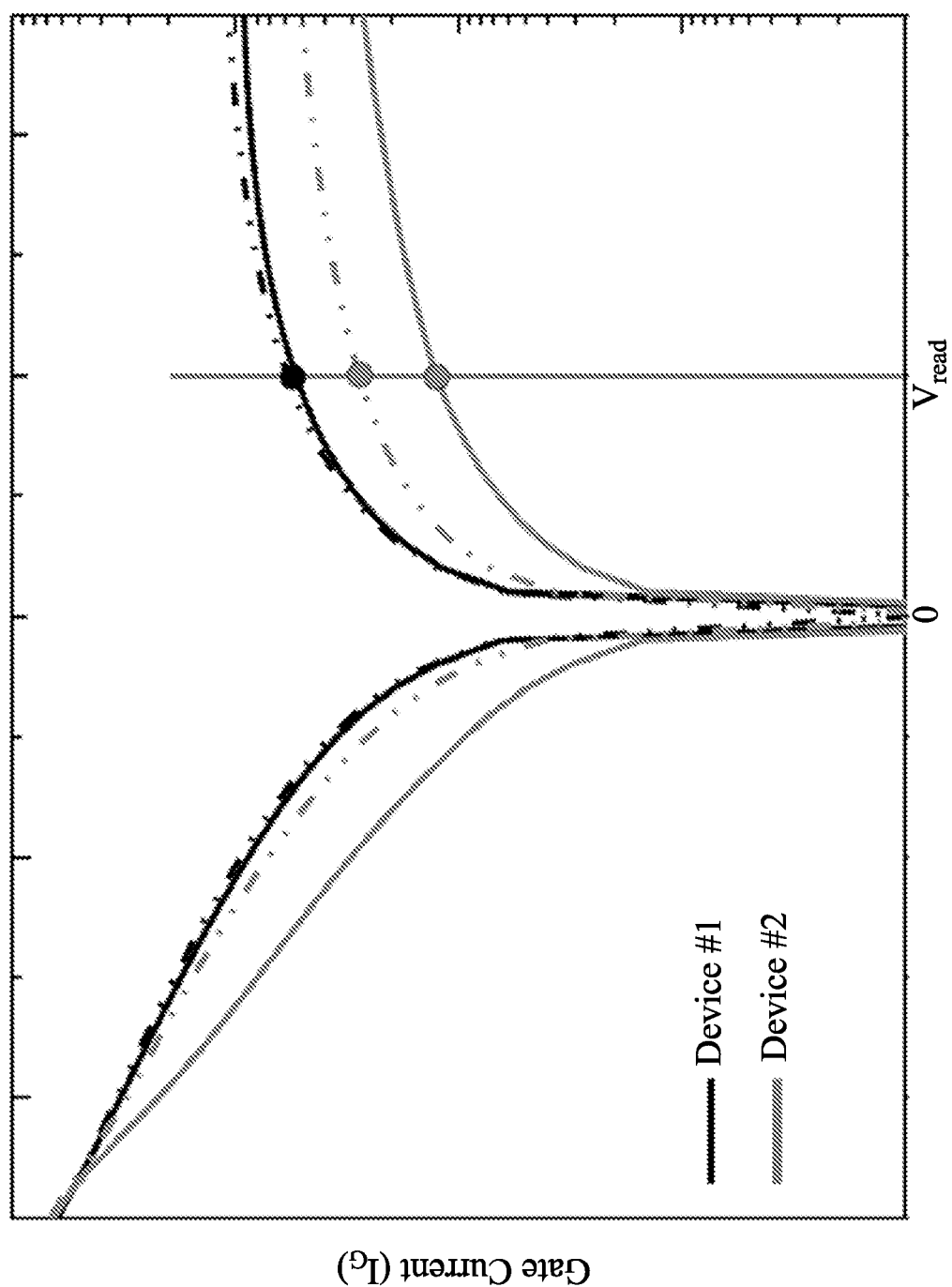
FIG. 3E illustrates a I-V characteristic of a trench-type MIS TD device for the stress-setting method in FIG. 2.

FIG. 3E illustrates a I-V characteristic of the trench-type MIS TD device for the stress-setting method in FIG. 2. In FIG. 3E, the gate bias voltage $V_G$ is shown on the horizontal axis, a gate current is shown on the vertical axis. In the figure, the solid line indicates the current read after reset operation $S_{reset}$ (referring to FIG. 2), and the dashed line indicates the current read after the set operation $S_{set}$ (referring to FIG. 2). The device #1 corresponds to a planar MIS TD device without the trench T1 and the passivation layer 142 (referring to FIGS. 1A and 1B), the device #2 corresponds to the trench-type MIS TD device 100 shown in FIGS. 1A and 1B.

Comparing the device #2 with the device #1, at the reading voltage $V_{read}$, a current window of the device #2 is greater than that of the device #1. From FIG. 3E, it is confirmed that by designing the MIS TD device with a trench structure, a current window can be enlarged.

Figure 3F:
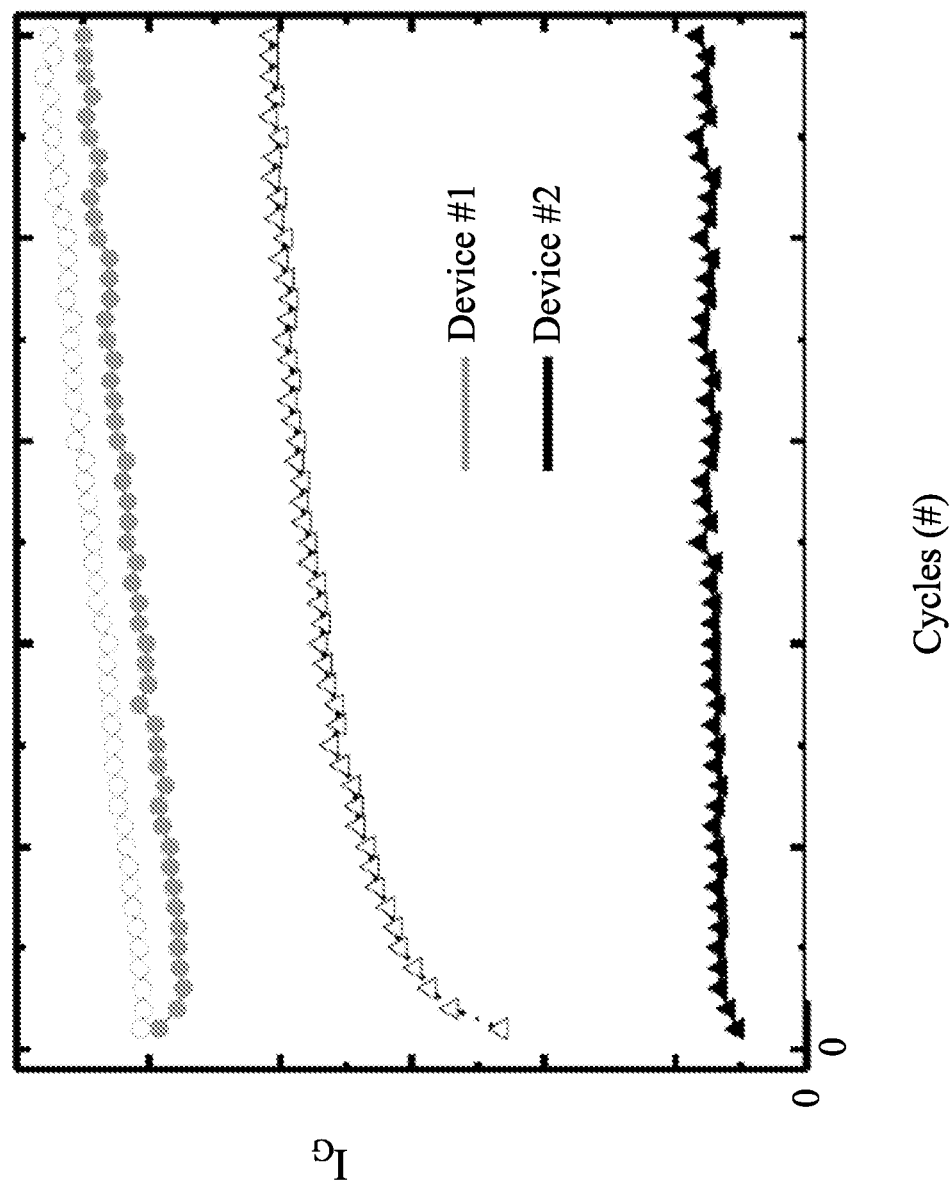
FIG. 3F is a plot of endurance characteristics of the MIS TD devices for the stress-setting method in FIG. 2.

FIG. 3F is a plot of endurance characteristics of the MIS TD devices for the stress-setting method in FIG. 2. In FIG. 3F, the number of cycles of reset and set operations is shown on the horizontal axis, a measured gate current is shown on the vertical axis. The solid dots indicate the currents read after the reset operation, and the hollow dots indicate the currents read after the set operation. These currents are read at a suitable reading voltage, such as 0.2 Volts.

For the planar device#1, the currents read after the reset operations (i.e., the solid circle dots) get larger as the number of cycles increases, which shows that the reset conditions are not stable. Furthermore, the currents read after the reset operations (i.e., the solid circle dots) are overlapping with or close to the currents read after the set operations (i.e., the hollow circle dots), which indicates a small current window.

For the trench-type device #2, the trench-type device has a stable level of the currents read after the reset operations (i.e., the solid triangular dots). The currents read after the set operations (i.e., the hollow triangular dots) are quite distinguished from the currents read after the reset operations (i.e., the solid triangular dots), which indicates a large current window. Comparing the planar device (i.e., circle dots) with the trench-type device (i.e., triangular dots), the trench-type device (i.e., triangular dots) has distinguished levels of the set and reset currents, which is beneficial for achieving the memory performance.

FIGS. 4-9 illustrate a method for fabricating a trench-type MIS TD device 100 at various stages in accordance with some embodiments of the present disclosure. It is understood that additional steps may be provided before, during, and after the steps shown by FIGS. 4-9, and some of the steps described below can be replaced or eliminated for additional embodiments of the method. The order of the operations/processes may be interchangeable.

Figure 4:
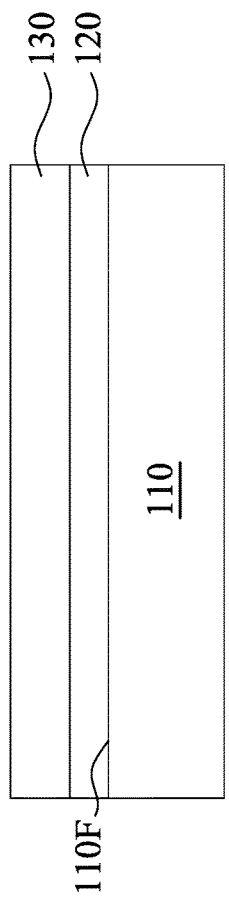

FIG. 4 illustrates a semiconductor substrate 110. In some embodiments, the semiconductor substrate 110 may be a semiconductor wafer, such as a silicon wafer. The semiconductor substrate 110 may be referred to as a semiconductor structure in some embodiments. The semiconductor substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. The semiconductor substrate 110 may be a p-type doped substrate, or an n-type doped substrate, which means that the semiconductor substrate 110 may be doped with either n type or p type dopants.

A tunneling film 120 is formed over a front surface 110F of the semiconductor substrate 110. The tunneling film 120 may include suitable dielectric materials, such as oxide, oxynitride, nitride, the like, or the combination thereof. In some embodiments, when the semiconductor substrate 110 is made of silicon, the tunneling film 120 may include silicon oxide, silicon oxynitride, or silicon nitride. In some other embodiments, the tunneling film 120 may include high-k dielectric materials. Formation of the tunneling film 120 may be using processes such as thermal oxidation, deposition, and/or suitable processes. A thickness of the tunneling film 120 may be in a range from about 0.5 nanometer to about less than 4 nanometers. The tunneling film 120 is formed at such a thickness that a tunnel current flows from the underlying substrate 110 to an electrode subsequently formed over the tunneling film 120. If the thickness of the tunneling layer 122 is less than about 0.5 nanometers, a reverse bias current may become too small, which may degrade memory performance. If the thickness of the tunneling layer 122 is greater than about 4 nanometers, current may not flow from the underlying substrate 110 to an electrode subsequently formed over the tunneling film 120.

A gate electrode layer 130 is then deposited over the tunneling film 120. The gate electrode layer 130 may include suitable conductive martials, such as doped polysilicon, Cu, Al, W, Co, Ru, or other metals, combinations thereof, or multi-layers thereof. The gate electrode layer 130 may be deposited by any suitable method, e.g., CVD, PECVD, PVD, ALD, and/or the like.

Figure 5:
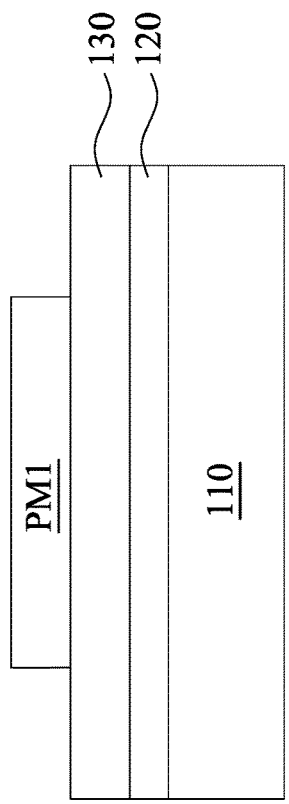
FIGS. 4-9 illustrate a method for fabricating a trench-type MIS TD device at various stages in accordance with some embodiments of the present disclosure.

Reference is made to FIG. 5. A patterned mask PM1 is formed over the gate electrode layer 130. The patterned mask PM1 may be a photoresist mask formed by photolithography patterning process. The photolithography patterning process may include photoresist coating (e.g., spin-on coating), soft baking, mask aligning, exposure, post-exposure baking, developing the photoresist, rinsing, drying (e.g., hard baking), and/or other applicable processes. In some alternative embodiments, the patterned mask PM1 may be a tri-layer resist layer, for example, including a bottom layer (e.g., $C_xH_yO_z$), a middle layer (e.g., $SiC_xH_yO_z$), and a photoresist top layer.

Figure 6B:
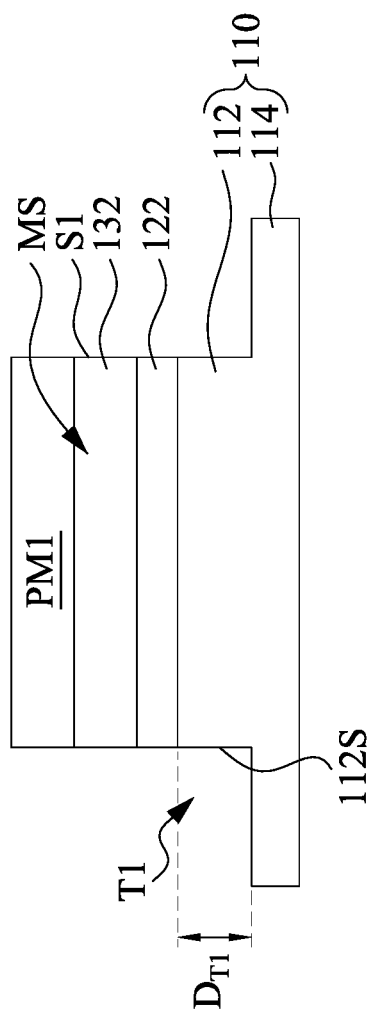
Figure 6A:
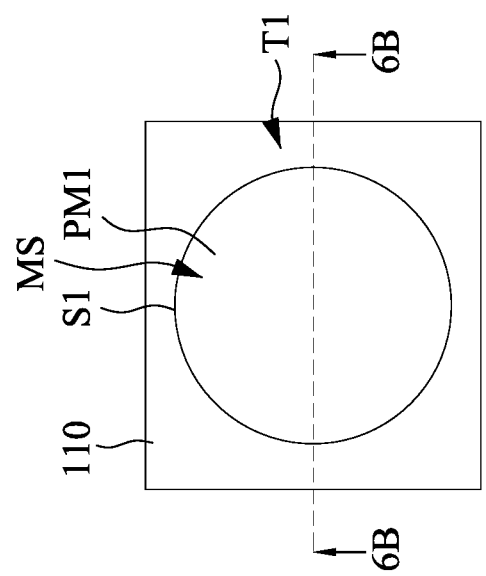

Reference is made to FIGS. 6A and 6B. FIG. 6A is a top view of the device in accordance with some embodiments of the present disclosure. FIG. 6B is a cross sectional view taken along line 6B-6B of FIG. 6A. The gate electrode layer 130 (referring to FIG. 5), the tunneling film 120 (referring to FIG. 5), and the substrate 110 are respectively patterned to form a gate electrode 132, a tunneling layer 122, and a protruding portion 112. The patterning process may include one or more etching processes using the patterned mask PM1 as etch mask. The etching processes may include dry etch, wet etch, or the combination thereof. Through the etching process, a trench T1 is etched in the gate electrode layer 130 (referring to FIG. 5), the tunneling film 120 (referring to FIG. 5), and the substrate 110, thereby forming a stack MS including the gate electrode 132, the tunneling layer 122, and the protruding portion 112. According to the pattern of the patterned mask PM1, the stack MS has a sidewall S1 adjacent the trench T1 when viewed from above. After the etching process, the substrate 110 has a base portion 114 extending horizontally beyond the sidewall S1 of the stack MS.

In some embodiments, a depth of the trench T1 in the substrate 110 (referred to as a depth $D_{T1}$), also considered as a height of the protruding portion 112 that is measured from a top surface of the base portion 114 to a top surface of the protruding portion 112, may be tuned by the trench etching process. In some embodiments, in order to control the trap/recombination of electrons at the trench edge region (e.g., a region near the protruding portion 112 but not directly below the gate electrode 132), the depth $D_{T1}$ may be in a range from about 5 nanometers to a depth of the depletion region (e.g., about 1 micrometer). If the depth $D_{T1}$ is greater than about 1 micrometer, the gate electrode may have poor control over the trap/recombination of electrons in the substrate. If the depth $D_{T1}$ is less than about 5 nanometers, the number of the charge trapping sites disposed at trench edge region may be too small to improve the performance of the memory device.

Figure 7:
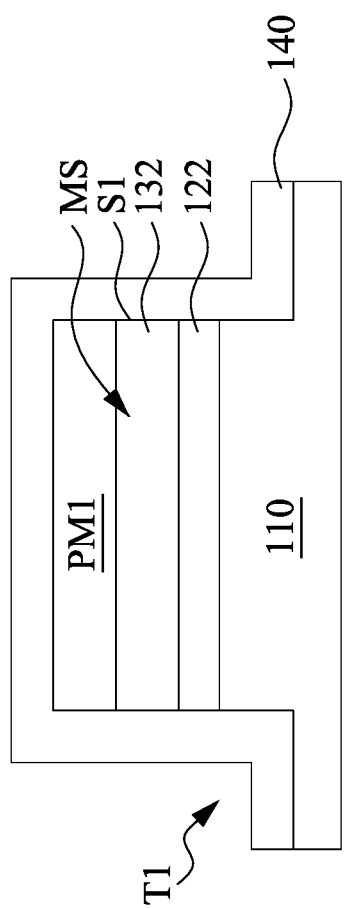

Reference is made to FIG. 7. A passivation film 140 is deposited over the structure of FIG. 6B. The passivation film 140 may include a suitable dielectric material, such as silicon oxide, silicon oxynitride, metal-containing compound materials (e.g., $Al_2O_3$), the like, or the combination thereof. The materials of the passivation film 140 may be deposited by any suitable method, e.g., CVD, PECVD, PVD, ALD, and/or the like. The deposited passivation film 140 may extend along the sidewall S1 of the stack MS, a bottom of the trench T1, and a top surface and a sidewall of the patterned mask PM1. The passivation film 140 may have a thickness in a range from about 0.5 nanometer to about 100 nanometers depending on the process technology limit. If the thickness of the passivation film 140 is greater than 100 nanometers, the thick passivation layer may affect the following process flows, for example, causing poor process window. If the thickness of the passivation film 140 is less than 0.5 nanometer, the interface between the substrate 110 and the passivation film 140 may become unstable, which may degrade the memory performance of the device. The thickness of the passivation film 140 may be equal to, or greater or less than the thickness of the tunneling layer 122.

Figure 8B:
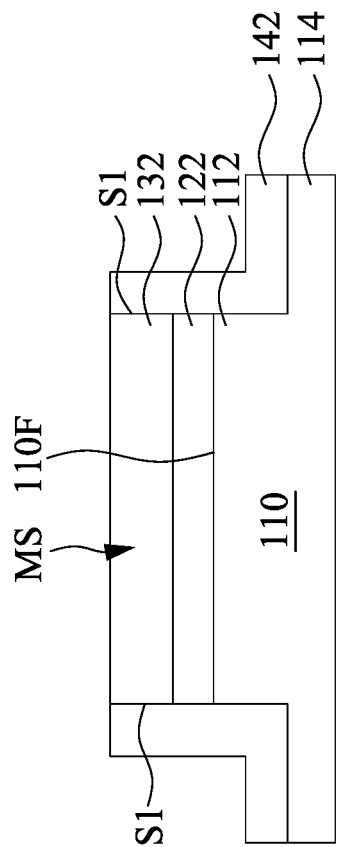
Figure 8A:
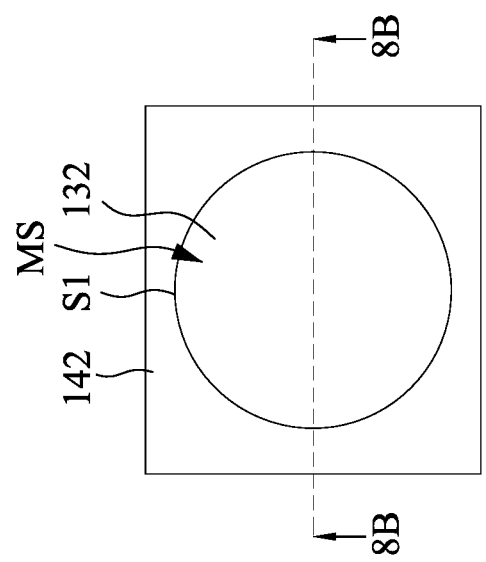

Reference is made to FIGS. 8A and 8B. FIG. 8A is a top view of the device in accordance with some embodiments of the present disclosure. FIG. 8B is a cross sectional view taken along line 8B-8B of FIG. 8A. A lift-off process is performed. For example, the patterned mask PM1 is stripped off, thereby removing a portion of the passivation film 140 (referring to FIG. 7) over the top surface of the patterned mask PM1 and a portion of the passivation film 140 (referring to FIG. 7) over the sidewall of the patterned mask PM1. In some embodiments, a plasma ashing or wet strip process is used to remove patterned mask PM1. In some embodiments, the plasma ashing process is followed by a wet dip in a sulfuric acid ($H_2SO_4$) solution to clean and remove remaining photoresist material. After the stripping process, a portion of the passivation film 140 (referring to FIG. 7) remains on the sidewall S1 of the stack MS and the bottom of the trench T1. The remaining portion of the passivation film 140 (referring to FIG. 7) may be referred to as a passivation layer 142 hereinafter.

In the present embodiments, the passivation layer 142 is over a sidewall of the protruding portion 112, a sidewall of the tunneling layer 122, and a sidewall of the gate electrode 132. The passivation layer 142 may form a closed loop around the stack MS (e.g., the protruding portion 112, the tunneling layer 122, and/or the gate electrode 132) when viewed from above. A top end of the passivation layer 142 may be higher than the top surface of the protruding portion 112, for example, level with a top surface of the gate electrode 132.

Figure 9:
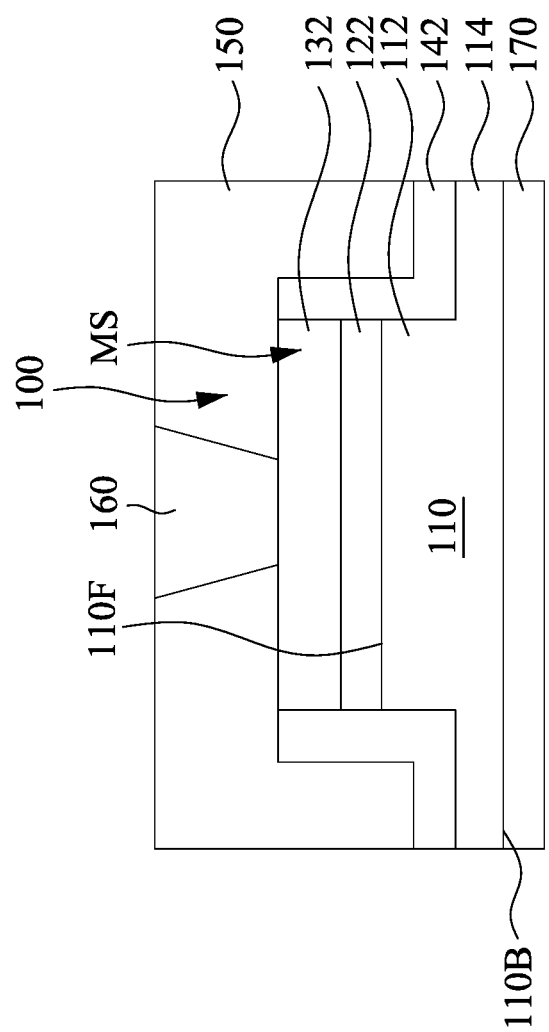

Reference is made to FIG. 9. A dielectric layer 150 is formed over the substrate 110. The dielectric layer 150 may include silicon oxide, oxynitride or other suitable materials. The dielectric layer 150 includes a single layer or multiple layers. The dielectric layer 150 can be formed by a suitable deposition technique, such as CVD. In some embodiments, the dielectric layer 150 may be referred to as an interlayer dielectric (ILD). At least one contact 160 is formed in the dielectric layer 150, and landing on the gate electrode 132. Formation of the contact 160 may include etching openings in the dielectric layer 150 followed by filling the openings with conductive material. A CMP process may be performed to remove a portion of the conductive material out of the openings, thereby forming the contact 160. One or more interconnect layers including metal lines/vias (not shown) may then be formed over the dielectric layer 150, thereby forming electrical paths.

In some embodiments, after the formation of the contact 160 and the interconnect layers (not shown), a bottom electrode 170 may be formed on a back surface 110B of the substrate 110 opposite to the front surface 110F. The bottom electrode 170 may include any suitable conductive materials, such as doped polysilicon or metals. The bottom electrode 170 may have a suitable pattern, in which at least a portion of the bottom electrode 170 is directly below the protruding portion 112. The bottom electrode 170 may be referred to as a conductive feature in some embodiments. In some other embodiments, the bottom electrode 170 may be formed on the back surface 110B prior to the fabrication process performed on the front surface 110F of the substrate 110 (e.g., the formation of the tunneling film shown in FIG. 4).

Through the steps, a device 100 including the bottom electrode 170, a semiconductor layer (e.g., the substrate 110), a tunneling layer (e.g., the tunneling layer 122), and a top electrode (e.g., the gate electrode 132) is formed. In some embodiments of the present disclosure, by the design of the trench T1 and the passivation layer 142, a number of charge trapping sites is disposed at trench edge region, which in turn will enlarge current window of the device 100.

FIGS. 10A-13 illustrate a method for fabricating a trench-type MIS TD device 100 at various stages in accordance with some embodiments of the present disclosure. It is understood that additional steps may be provided before, during, and after the steps shown by FIGS. 10A-13, and some of the steps described below can be replaced or eliminated for additional embodiments of the method. The order of the operations/processes may be interchangeable. The fabrication process of the present embodiments is similar to the device 100 of FIGS. 4-9, except that plural trenches T2 may be formed during the formation of the trench T1.

Figure 10B:
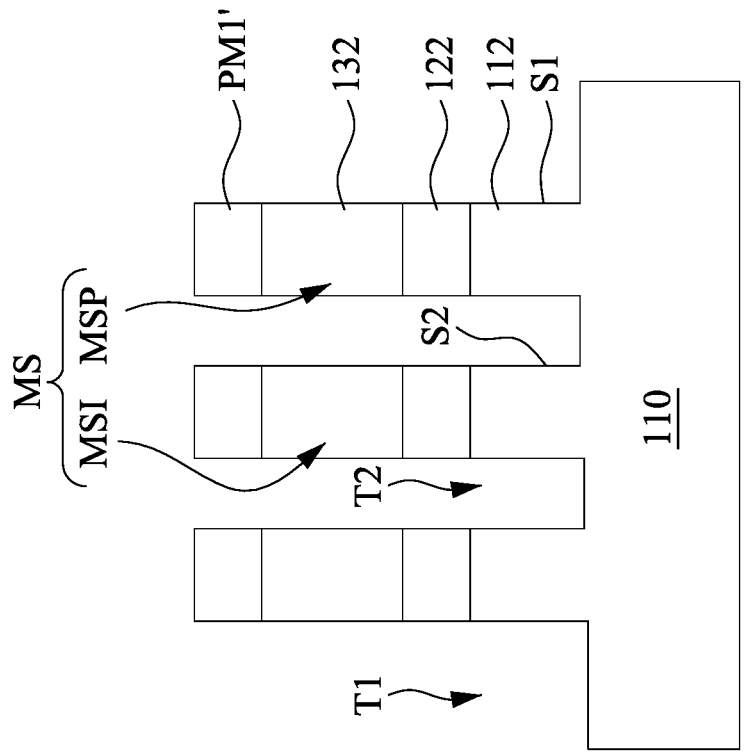
FIGS. 10A-13 illustrate a method for fabricating a trench-type MIS TD device at various stages in accordance with some embodiments of the present disclosure.
Figure 10A:
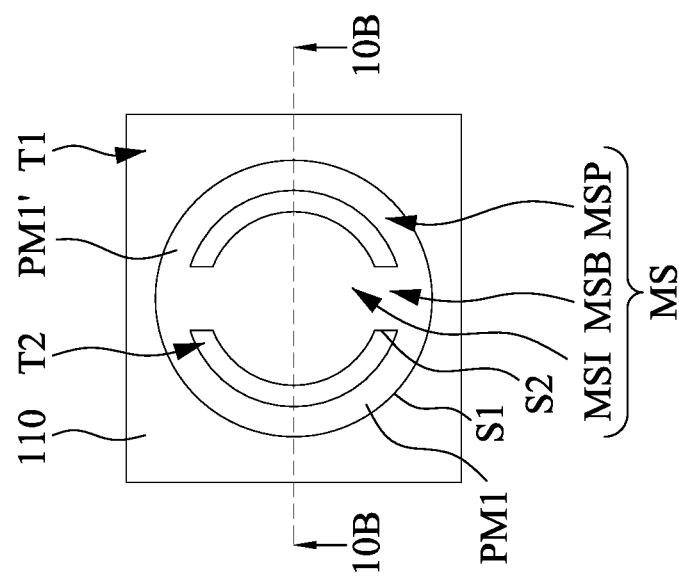

Reference is made to FIGS. 10A and 10B. FIG. 10A is a top view of the device in accordance with some embodiments of the present disclosure. FIG. 10B is a cross sectional view taken along line 10B-10B of FIG. 10A. Following the step shown in FIG. 4, a patterned mask PM1' is formed over the gate electrode layer 130. The patterned mask PM1' may be a photoresist mask formed by photolithography patterning process. The patterned mask PM1' may be a tri-layer resist layer, for example, including a bottom layer (e.g., $C_xH_yO_z$), a middle layer (e.g., $SiC_xH_yO_z$), and a photoresist top layer.

The gate electrode layer 130 (referring to FIG. 4), the tunneling film 120 (referring to FIG. 4), and the substrate 110 are respectively patterned to form a gate electrode 132, a tunneling layer 122, and a protruding portion 112. The patterning process may include one or more etching processes using the patterned mask PM1' as etch mask. The etching processes may include dry etch, wet etch, or the combination thereof. Through the etching process, according to the pattern of the patterned mask PM1', trenches T1 and T2 are etched in the gate electrode layer 130 (referring to FIG. 4), the tunneling film 120 (referring to FIG. 4), and the substrate 110, thereby forming a stack MS including the gate electrode 132, the tunneling layer 122, and the protruding portion 112. Therefore, the stack MS has an outer sidewall S1 adjacent the trench T1 and one or more inner sidewalls S2 adjacent the trenches T2.

In some embodiments, the stack MS may include an inner portion MSI, a peripheral portion MSP, and a bridging portion MSB connecting the inner portion MSI to the peripheral portion MSP. Each of the inner portion MSI, the peripheral portion MSP, and the bridging portion MSB may include a portion of the gate electrode 132, a portion of the tunneling layer 122, and a portion of the protruding portion 112. For example, the portions of the gate electrode 132 of the inner portion MSI, the peripheral portion MSP, and the bridging portion MSB are continuously connected and at the same voltage potential when a voltage is applied on the gate electrode 132. The portions of the tunneling layer 122 of the inner portion MSI, the peripheral portion MSP, and the bridging portion MSB may be continuously connected. The portions of the protruding portion 112 of the inner portion MSI, the peripheral portion MSP, and the bridging portion MSB may be continuously connected.

Figure 11:
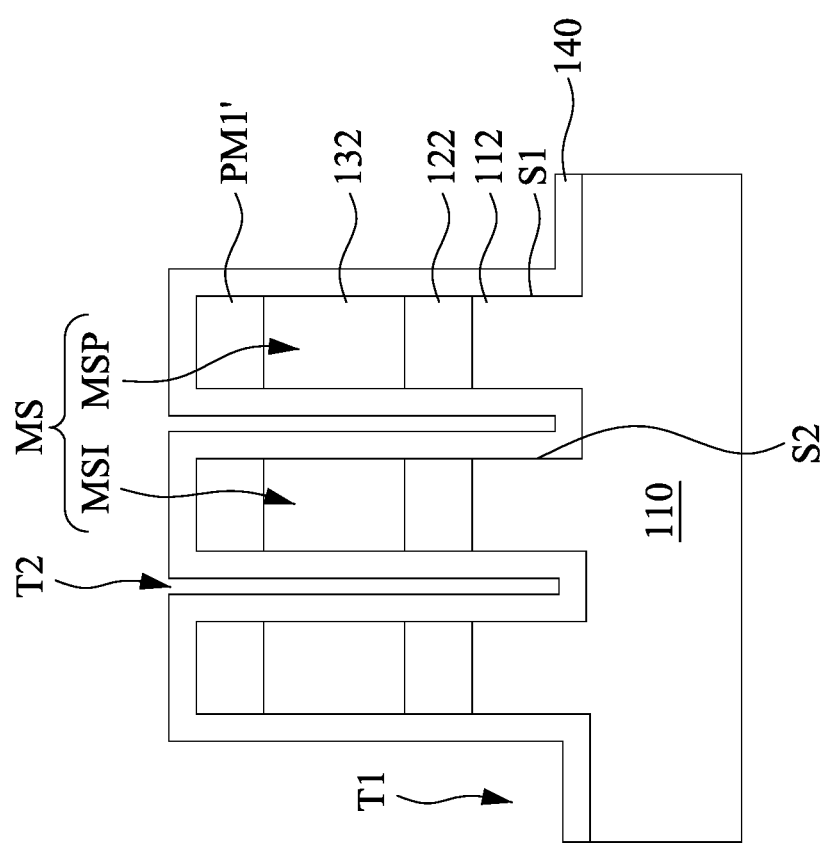

Reference is made to FIG. 11. A passivation film 140 is deposited over the structure of FIG. 10B. The deposited passivation film 140 may extend along and cover sidewalls S1 and S2 of the stack MS, bottoms of the trenches T1 and T2, and a top surface and sidewalls of the patterned mask PM1'.

Figure 12B:
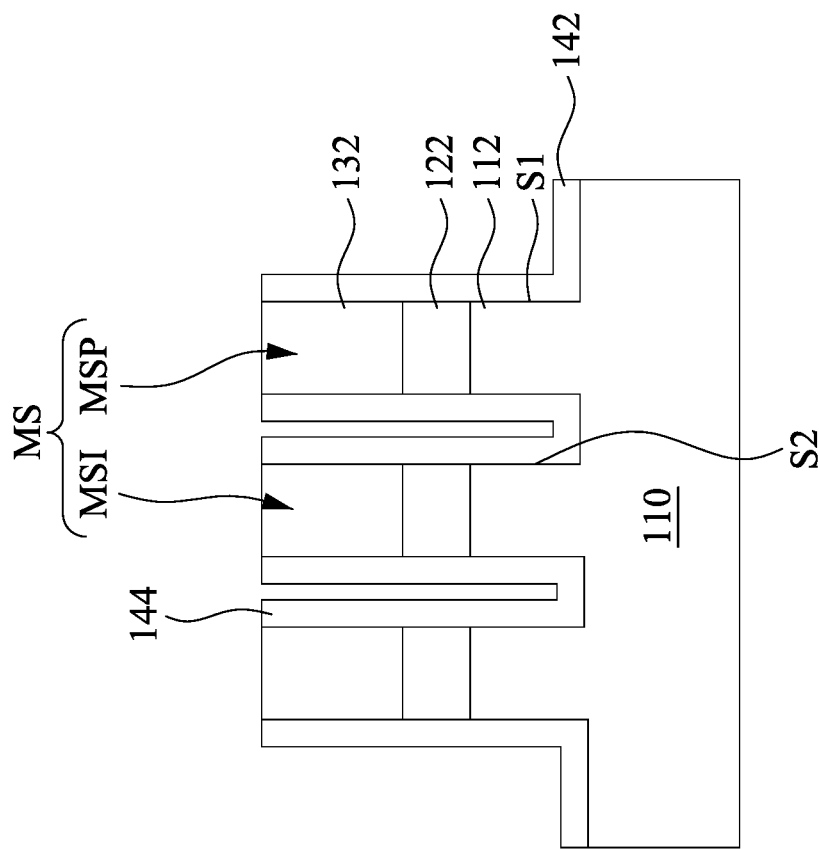
Figure 12A:
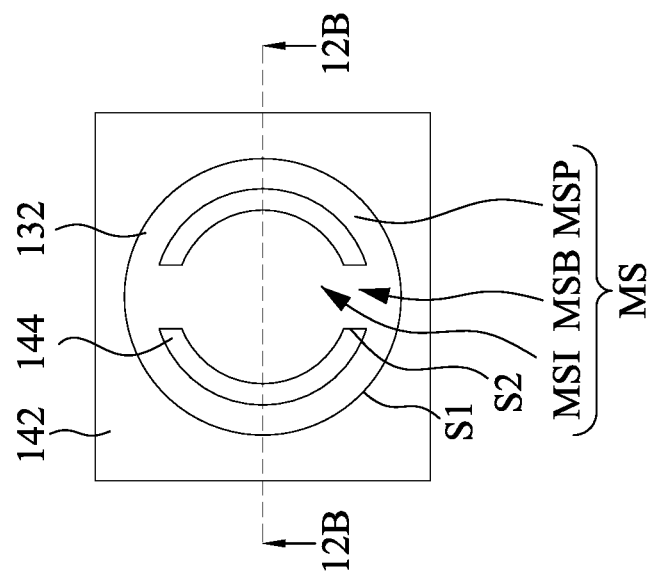

Reference is made to FIGS. 12A and 12B. FIG. 12A is a top view of the device in accordance with some embodiments of the present disclosure. FIG. 12B is a cross sectional view taken along line 12B-12B of FIG. 12A. A lift-off process is performed. The patterned mask PM1' (referring to FIG. 11) is stripped off, thereby removing a portion of the passivation film 140 (referring to FIG. 11) over the top surface of the patterned mask PM1' (referring to FIG. 11) and a portion of the passivation film 140 (referring to FIG. 11) over the sidewalls of the patterned mask PM1' (referring to FIG. 11). A portion of the passivation film 140 (referring to FIG. 11) remains on the sidewall S1 and the bottom of the trench T1 may be referred to as a passivation layer 142, and another portions of the passivation film 140 (referring to FIG. 11) remain on the sidewalls S2 the bottoms of the trench T2 may be referred to as passivation layers 144.

Figure 13:
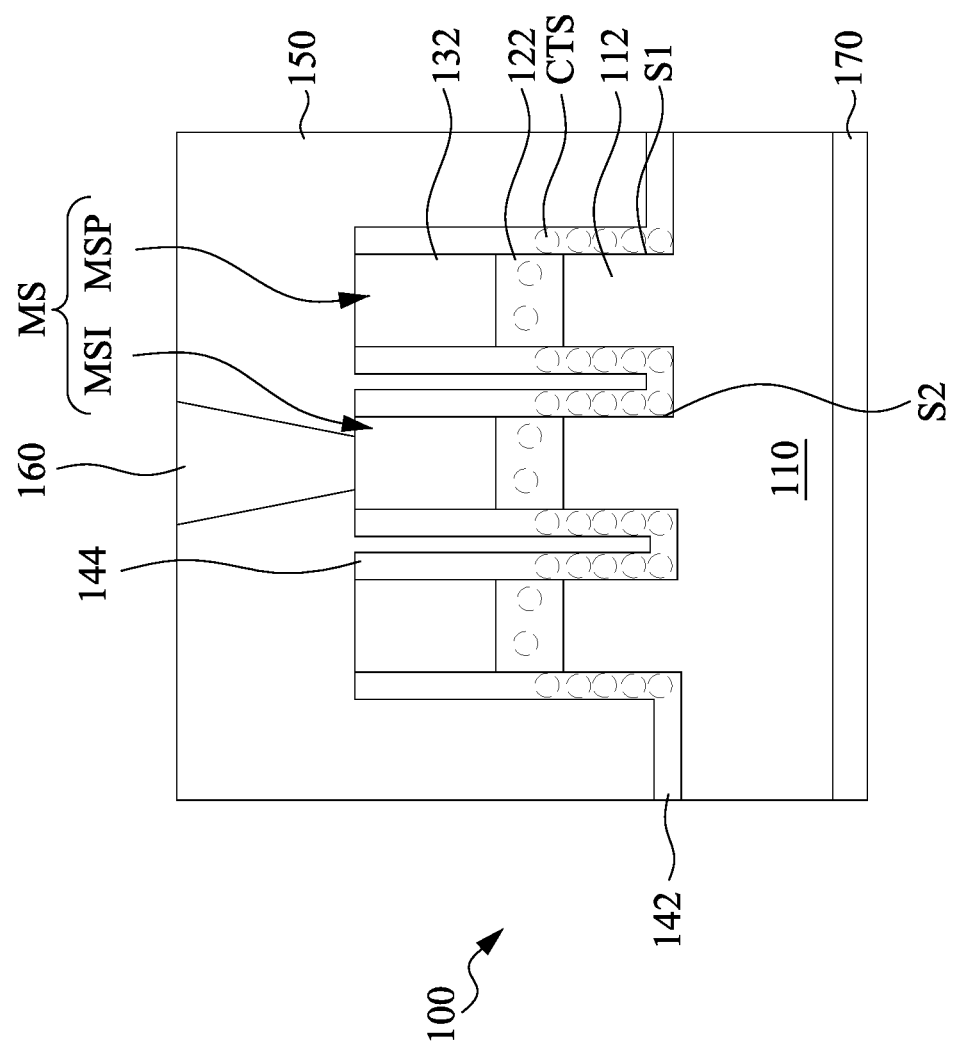

Reference is made to FIG. 13. As aforementioned, a dielectric layer 150 is formed over the substrate 110, and then a contact 160 is formed in the dielectric layer 150, and landing on the gate electrode 132. A bottom electrode 170 may be formed on a back surface 110B of the substrate 110 opposite to the front surface 110F. Through the steps, a device 100 including the bottom electrode 170, a semiconductor layer (e.g., the substrate 110), a tunneling layer (e.g., the tunneling layer 122), and a top electrode (e.g., the gate electrode 132) is formed. In some embodiments of the present disclosure, by the design of the passivation layers 142 and 144, the number of charge trapping sites (indicated by the circles CTS) at trench edge region is increased, which in turn will enlarge current window of the device 100. Other details of the present embodiments are similar to those illustrated in the embodiments of FIGS. 4-9, and therefore not repeated herein.

Figure 14C:
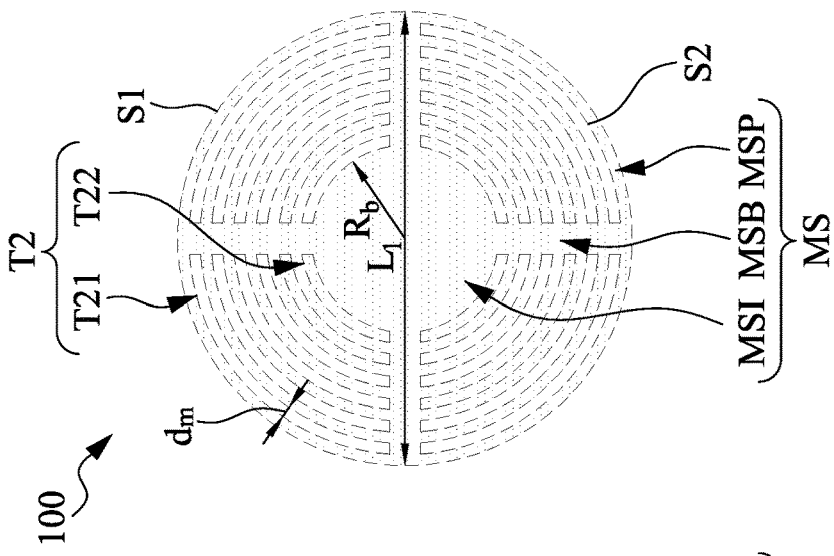
FIGS. 14A-14C illustrate top views of various trench-type MIS TD devices in accordance with some embodiments of the present disclosure.
Figure 14B:
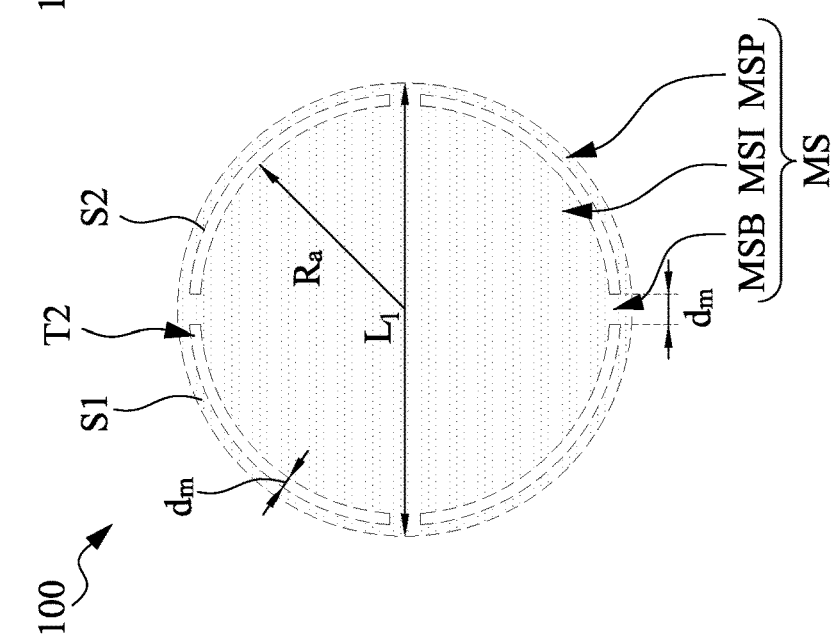
Figure 14A:
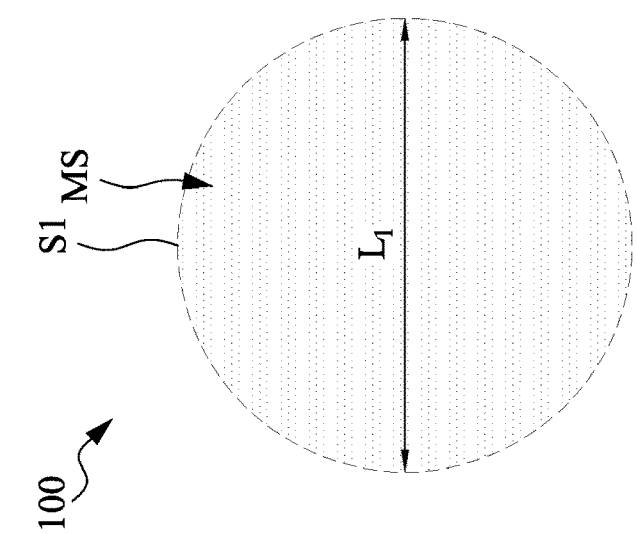

FIGS. 14A-14C illustrate top views of stacks MS of various trench-type MIS TD devices 100 in accordance with some embodiments of the present disclosure. The trench edge region is indicated by dashed lines in the figures. For clear illustration, the stacks MS in FIGS. 14A-14C are illustrated as having a diameter $L_1$ when viewed from above.

For example, a value of the diameter $L_1$ is equal to a longest distance between any two vertices of the stacks MS.

In FIG. 14A, the stack MS is a solid structure without any spaces (e.g., trench) formed thereon. As a result, from the top view, the trench edge region around the stack MS may have a length substantially equal to a length of the sidewall 51. For example, a perimeter of the trench edge region viewed from top is equal to $\pi L_1$.

In FIG. 14B, the stack MS is a structure having trenches T2 formed between the inner potion MSI and the peripheral potion MSP. As a result, the trench edge region around the stack MS may have a length related to both a length of the sidewall 51 and a length of the sidewalls S2. In the examples, it is assumed that widths of the trenches T2, the peripheral portions MSP, and the bridge portions MSB are the same as a minimum metal width $d_m$ of the technology node. Base on the assumption, a radius $R_a$ of the inner portion MSI is substantially equal to $0.5L_1-2d_m$, and a perimeter of the trench edge region viewed from top is substantially equal to $\pi(3L_1-6\ dm)$.

In FIG. 14C, the stack MS is a structure having an inner potion MSI, plural rings of the peripheral potions MSP, and a bridging region MSB connecting the rings of the peripheral potions MSP to the inner potion MSI. The stack MS may have trenches T21 formed between two rings of the peripheral potions MSP, and trenches T22 between the inner potion MSI and an innermost ring of the peripheral potions MSP. As a result, the trench edge region around the stack MS may have a length related to both a length of the sidewall 51 and a length of the sidewalls S2. In the example, it is assumed that widths of the trenches T21-T22, the peripheral portions MSP, and the bridge portions MSB are the same as a minimum metal width $d_m$ of the technology node. Base on the assumption, a radius $R_b$ of the inner portion MSI is equal to $0.5L_1-12d_m$, and a perimeter of the trench edge region when viewed from above is equal to $\pi(13L_1-156d_m)$. Through these figures, as the configuration of trench T2 increases the perimeter of the trench edge region, a number of charge trapping sites at trench edge region is increased, thereby enlarging the current window of the device 100. Other details of the devices in FIGS. 14A-14C are similar to those mentioned in previous embodiments, and thereto not repeated herein.

FIGS. 15A-15C illustrate top views of stacks MS of various trench-type MIS TD devices 100 in accordance with some embodiments of the present disclosure. In FIG. 15A, the stacks MS are illustrated as having a rectangular shape, such as a square shape. In FIG. 15B, the stacks MS are illustrated as having a triangular shape. In FIG. 15C, the stacks MS are illustrated as having a square shape with a trench T2 therein, thereby increasing the perimeter of the trench edge region. In some other embodiments, depending on design requirement, the stack MS of the device 100 may have a bar shape, a polygonal shape, ellipse, other suitable shapes, or the combination thereof. Other details of the devices in FIGS. 15A-15C are similar to those mentioned in previous embodiments, and thereto not repeated herein.

FIGS. 16-19 illustrate a method for fabricating a trench-type MIS TD device at various stages in accordance with some embodiments of the present disclosure. It is understood that additional steps may be provided before, during, and after the steps shown by FIGS. 16-19, and some of the steps described below can be replaced or eliminated for additional embodiments of the method. The order of the operations/processes may be interchangeable. The fabrication process of the present embodiments is similar to the device 100 of FIGS. 4-9, except that the trench T1 is etched prior to the formation of the tunneling film 120.

Figure 16:
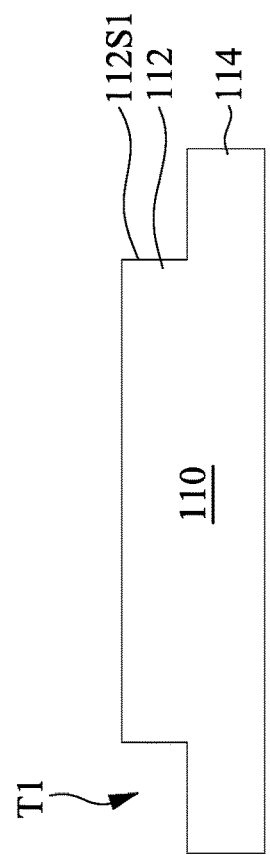

Reference is made to FIG. 16. A trench T1 is etched in the substrate 110, thereby forming a protruding portion 112 over the substrate 110. The trench T1 may be formed by a series of operations including photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). After the formation of the trench T1, the protruding portion 112 may have a sidewall 112S1 adjacent the trench T1. After the etching process, the substrate 110 has a base portion 114 extending horizontally beyond the sidewall 112S1 of the protruding portion 112.

Figure 17:
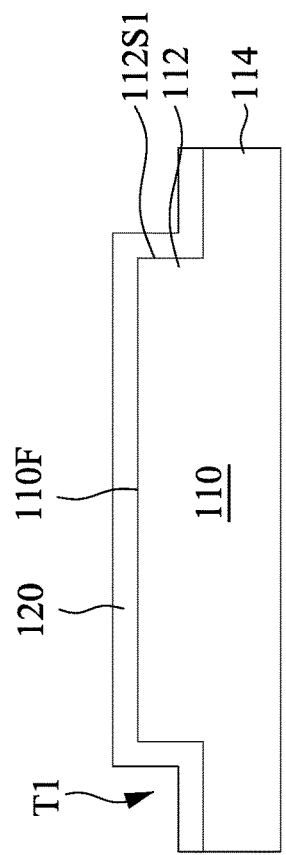
FIGS. 16-19 illustrate a method for fabricating a trench-type MIS TD device at various stages in accordance with some embodiments of the present disclosure.

Reference is made to FIG. 17. A tunneling film (also referred to as a tunneling layer) 120 is formed over the front surface 110F of the substrate 110. The tunneling film 120 covers the sidewall 112S of the protruding portion 112, a top surface of the protruding portion 112, and a bottom of the trench T1. As aforementioned, the tunneling film 120 may include suitable dielectric materials, such as oxide, oxynitride, nitride, the like, or the combination thereof. Formation of the tunneling film 120 may be using processes such as thermal oxidation, deposition, and/or suitable processes.

Figure 18B:
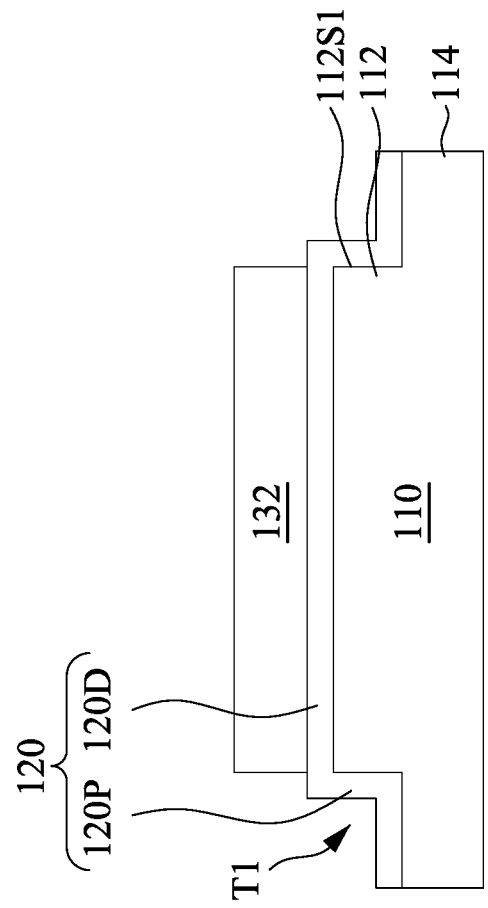
Figure 18A:
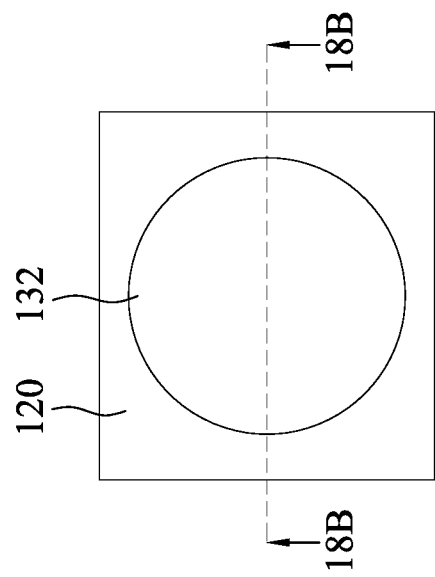

Reference is made to FIGS. 18A and 18B. FIG. 18A is a top view of the device in accordance with some embodiments of the present disclosure. FIG. 18B is a cross sectional view taken along line 18B-18B of FIG. 18A. A gate electrode 132 is formed over the tunneling film 120. The gate electrode 132 may be formed by a series of operations including deposition, photolithography patterning, and etching processes. The deposition process includes depositing suitable conductive martials (e.g., doped polysilicon or metals) by suitable deposition process. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). After the formation of the gate electrode 132, the tunneling film 120 has a portion 120D directly below the gate electrode 132 and over the top surface of the protruding portion 112 and a potion 120P not directly below the gate electrode 132. The portion 120P may have a portion on the sidewall 112S1 of the protruding portion 112, and a portion extending along a top surface of the base portion 114. The portion 120P of the tunneling film 120 may be used as a passivation layer.

Figure 19:
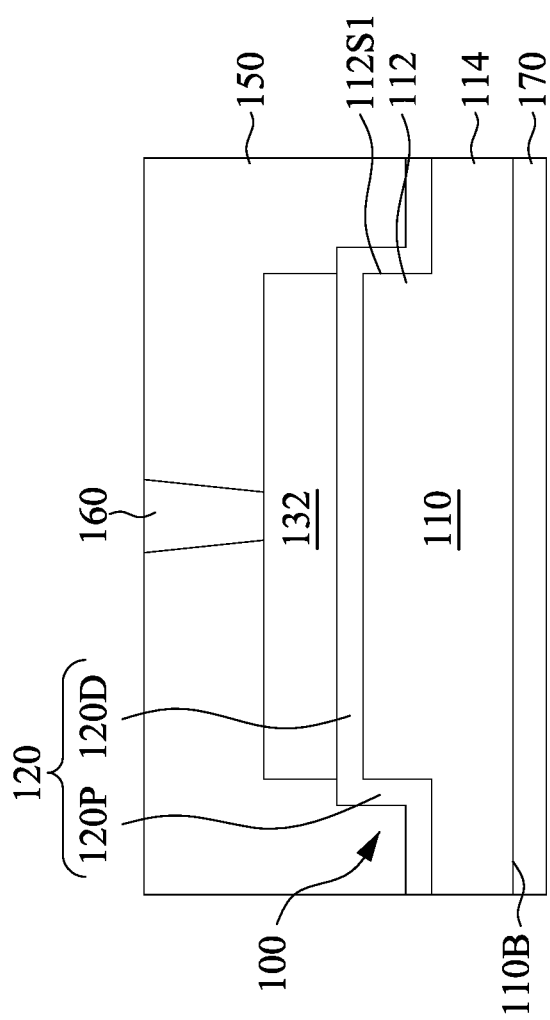

Reference is made to FIG. 19. A dielectric layer 150 is formed over the substrate 110, and then a contact 160 is formed in the dielectric layer 150, and landing on the gate electrode 132. A bottom electrode 170 may be formed on a back surface 110B of the substrate 110 opposite to the front surface 110F. Through the steps, a device 100 including the bottom electrode 170, a semiconductor layer (e.g., the substrate 110), a tunneling layer (e.g., the tunneling film 120), and a top electrode (e.g., the gate electrode 132) is formed. In some embodiments of the present disclosure, by the design of the potion 120P of the tunneling film 120, a number of charge trapping sites is disposed at trench edge region, which in turn will enlarge current window of the device 100. Other details of the present embodiments are similar to those illustrated in the embodiments of FIGS. 4-9, and therefore not repeated herein.

FIGS. 20A-22 illustrate a method for fabricating a trench-type MIS TD device at various stages in accordance with some embodiments of the present disclosure. It is understood that additional steps may be provided before, during, and after the steps shown by FIGS. 20A-22, and some of the steps described below can be replaced or eliminated for additional embodiments of the method. The order of the operations/processes may be interchangeable. The fabrication process of the present embodiments is similar to the device 100 of FIGS. 16-19, except that plural trenches T2 may be formed during the formation of the trench T1.

FIG. 20A illustrates a top view of a device in accordance with some embodiments of the present disclosure. FIG. 20B is a cross-sectional view taken along line 20B-20B in FIG. 20A. The trenches T1 and T2 may be formed by a series of operations including photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). After the formation of the trenches T1 and T2, the protruding portion 112 may have a sidewall 112S1 adjacent the trench T1 and sidewalls 112S2 adjacent the trenches T2.

Figures 21A, 21B:
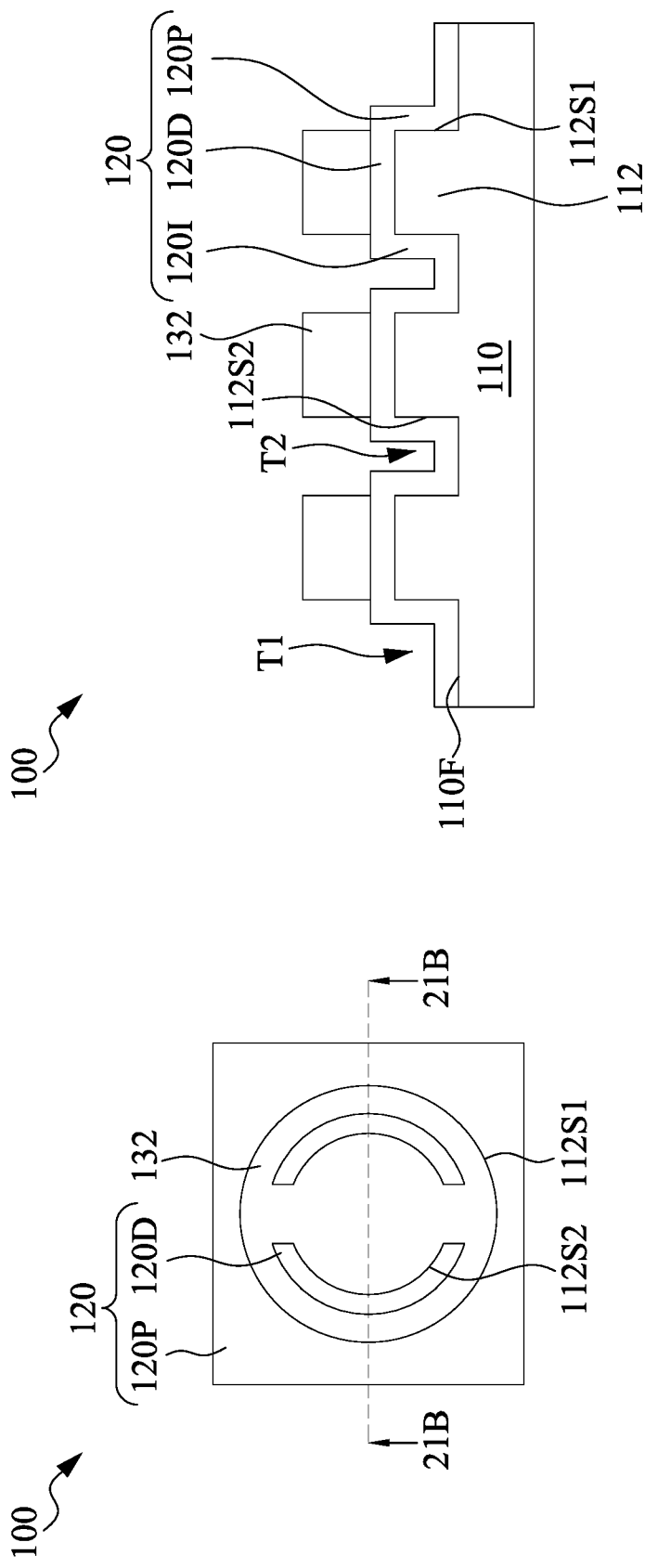

Reference is made to FIGS. 21A and 21B. FIG. 21A illustrate a top view of a device in accordance with some embodiments of the present disclosure. FIG. 21B is a cross-sectional view taken along line 21B-21B in FIG. 21A. After the formation of the trenches T1 and T2, a tunneling film 120 is formed over the front surface 110F of the structure of FIGS. 20A and 20B. The tunneling film 120 covers the sidewall 112S1 and sidewalls 112S2 of the protruding portion 112, a top surface of the protruding portion 112, and bottoms of the trenches T1 and T2. Subsequently, a gate electrode 132 is formed over the tunneling film 120. After the formation of the gate electrode 132, the tunneling film 120 has a portion 120D directly below the gate electrode 132 and potions 120I and 120P not directly below the gate electrode 132. The portions 120I may surround sidewalls 112S2 of the protruding portion 112, and the portion 120P may surround the sidewall 112S1 of the protruding portion 112.

Figure 22:
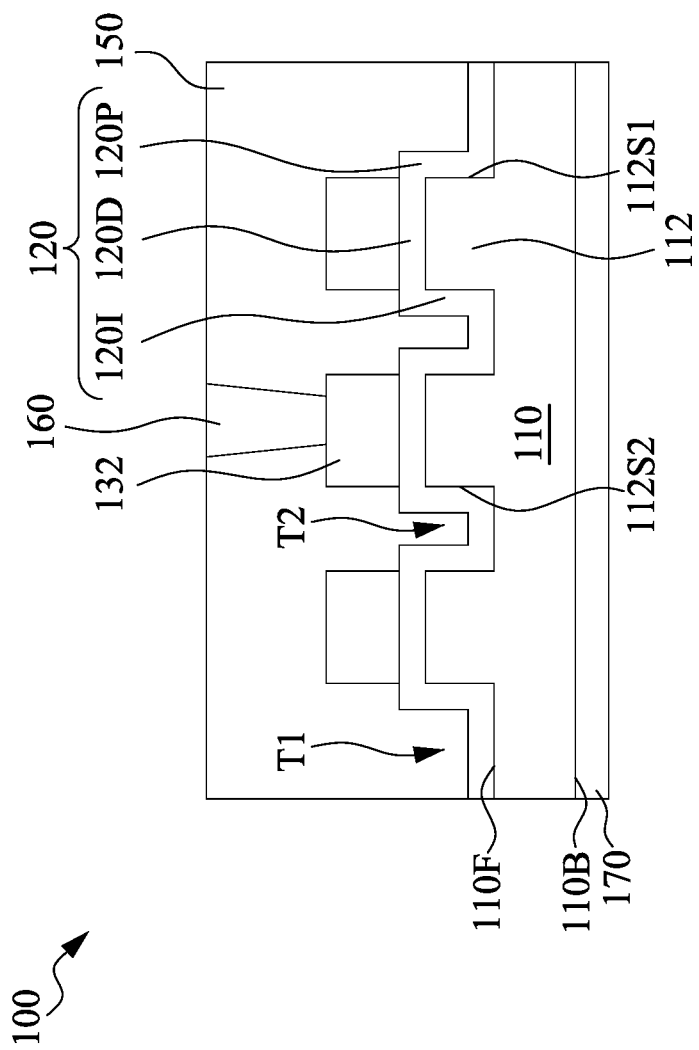

Reference is made to FIG. 22. A dielectric layer 150 is formed over the substrate 110, and then a contact 160 is formed in the dielectric layer 150, and landing on the gate electrode 132. A bottom electrode 170 may be formed on a back surface 110B of the substrate 110 opposite to the front surface 110F. Through the steps, a device 100 including the bottom electrode 170, a semiconductor layer (e.g., the substrate 110), a tunneling layer (e.g., the tunneling film 120), and a top electrode (e.g., the gate electrode 132) is formed. In some embodiments of the present disclosure, by the design of the portions 120I and 120P of the tunneling film 120, the number of charge trapping sites at trench edge region is further increased, which in turn will enlarge current window of the device 100. Other details of the present embodiments are similar to those illustrated in the embodiments of FIGS. 16-19, and therefore not repeated herein.

FIGS. 23A-30 illustrate a method for fabricating an integrated circuit device at various stages in accordance with some embodiments of the present disclosure. It is understood that additional steps may be provided before, during, and after the steps shown by FIGS. 23A-30, and some of the steps described below can be replaced or eliminated for additional embodiments of the method. The order of the operations/processes may be interchangeable.

Figure 23A:
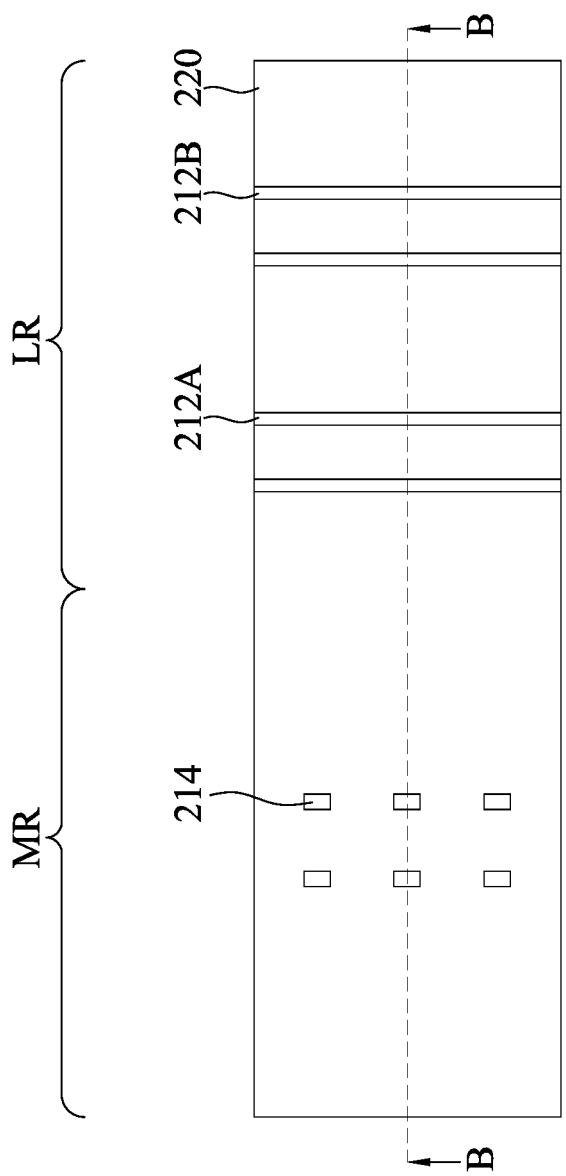
FIGS. 23A-30 illustrate a method for fabricating an integrated circuit device at various stages in accordance with some embodiments of the present disclosure.
Figure 23B:
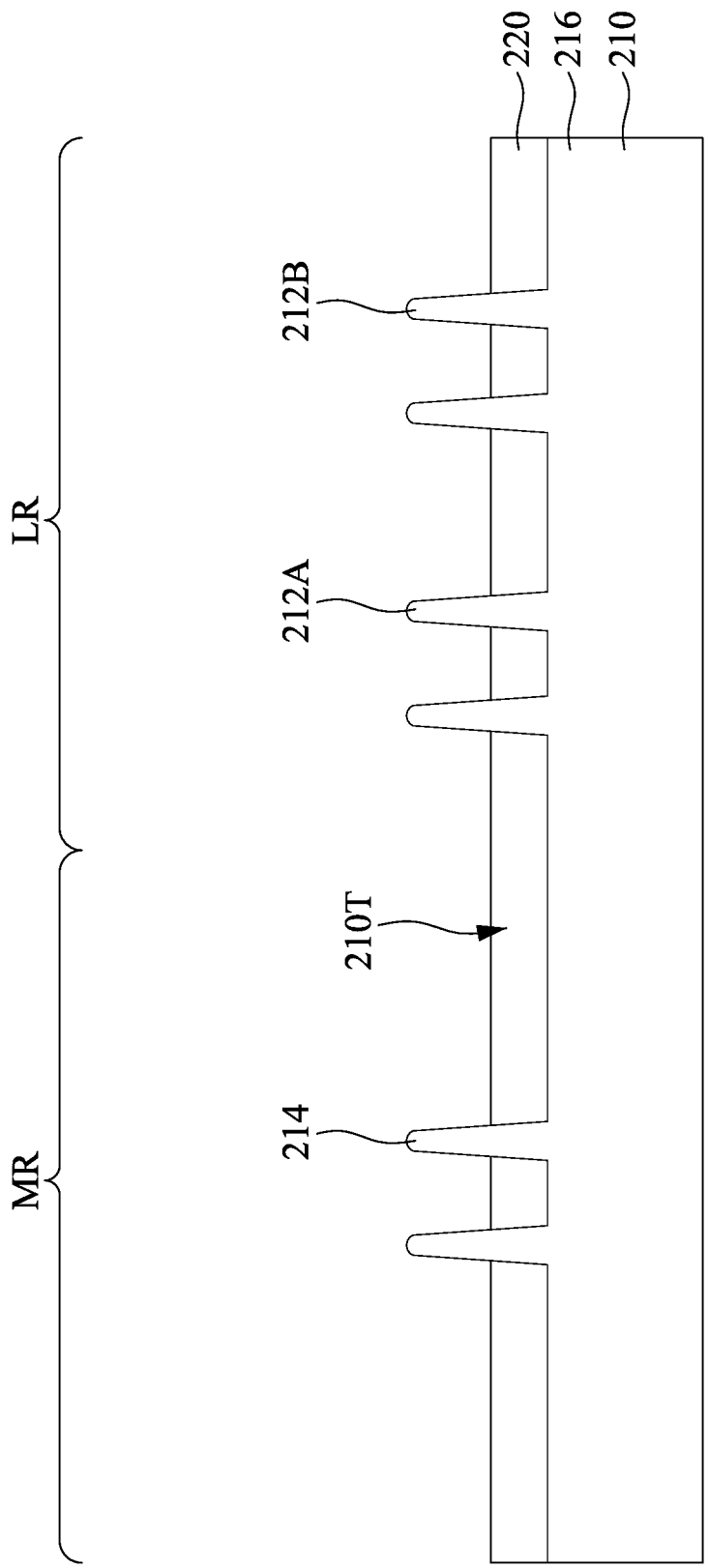

Reference is made to FIGS. 23A and 23B. FIG. 23A is a top view of an integrated circuit device at an intermediate stage of fabrication process according to some embodiments of the present disclosure. FIG. 23B is a cross-sectional view taken along line B-B in FIG. 23A. A semiconductor substrate 210 including plural semiconductor fins 212A and 212B and protruding portions 214 is provided. The substrate 210 may be a bulk silicon substrate. Alternatively, the substrate 210 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods. The semiconductor substrate 210 may be a p-type doped substrate, or an n-type doped substrate, which means that the semiconductor substrate 210 may be doped with either n-type or p-type impurities or dopants. For better illustration, the substrate 210 is illustrated as having a memory region MR where the protruding portions 214 are disposed, and a transistor region LR where the semiconductor fins 212A and 212B are disposed.

The semiconductor fins 212A and 212B and protruding portions 214 may be formed by any suitable method. For example, the semiconductor fins 212A and 212B and protruding portions 214 may be formed by using one or more photolithography processes, including double-patterning or multi-patterning processes, and etching process. Generally, double-patterning or multi-patterning processes combine photolithography and self-aligned processes, allowing patterns to be created that have, for example, pitches smaller than what is otherwise obtainable using a single, direct photolithography process. The etching processes may include dry etching, wet etching, and/or other etching methods (e.g., reactive ion etching). Through the etching process, trenches 210T are etched in the substrate 210. After the etching process, the substrate 210 has a base portion 216 extending horizontally beyond the sidewalls of the semiconductor fins 212A and 212B and protruding portions 214.

In some embodiments, a length of the protruding portion 214 is different from lengths of the semiconductor fins 212A and 212B when viewed from above. For example, in the present embodiments, the lengths of the semiconductor fins 212A and 212B are greater than the length of the protruding portion 214 when viewed from above. In some other embodiments, the lengths of the semiconductor fins 212A and 212B may be equal to or less than the length of the protruding portion 214 when viewed from above. The protruding portion 214 has a rectangular top view in the present embodiments. In some other embodiments, the protruding portion 214 may have a top view of a bar shape, a polygonal shape, ellipse, other suitable shapes, or the combination thereof.

Isolation structures 220 are formed over the base portion 216 of the substrate 210 and adjacent the semiconductor fins 212A and 212B and protruding portions 214. The isolation structures 220, which act as a shallow trench isolation (STI) around the semiconductor fins 212A and 212B and protruding portions 214 may be formed by chemical vapor deposition (CVD) techniques using tetra-ethyl-ortho-silicate (TEOS) and oxygen as a precursor, followed by planarization process and etching back the TEOS oxides. After etching back process, the semiconductor fins 212A and 212B and protruding portions 214 may have top surfaces higher than the isolation structures 220.

Figure 24:
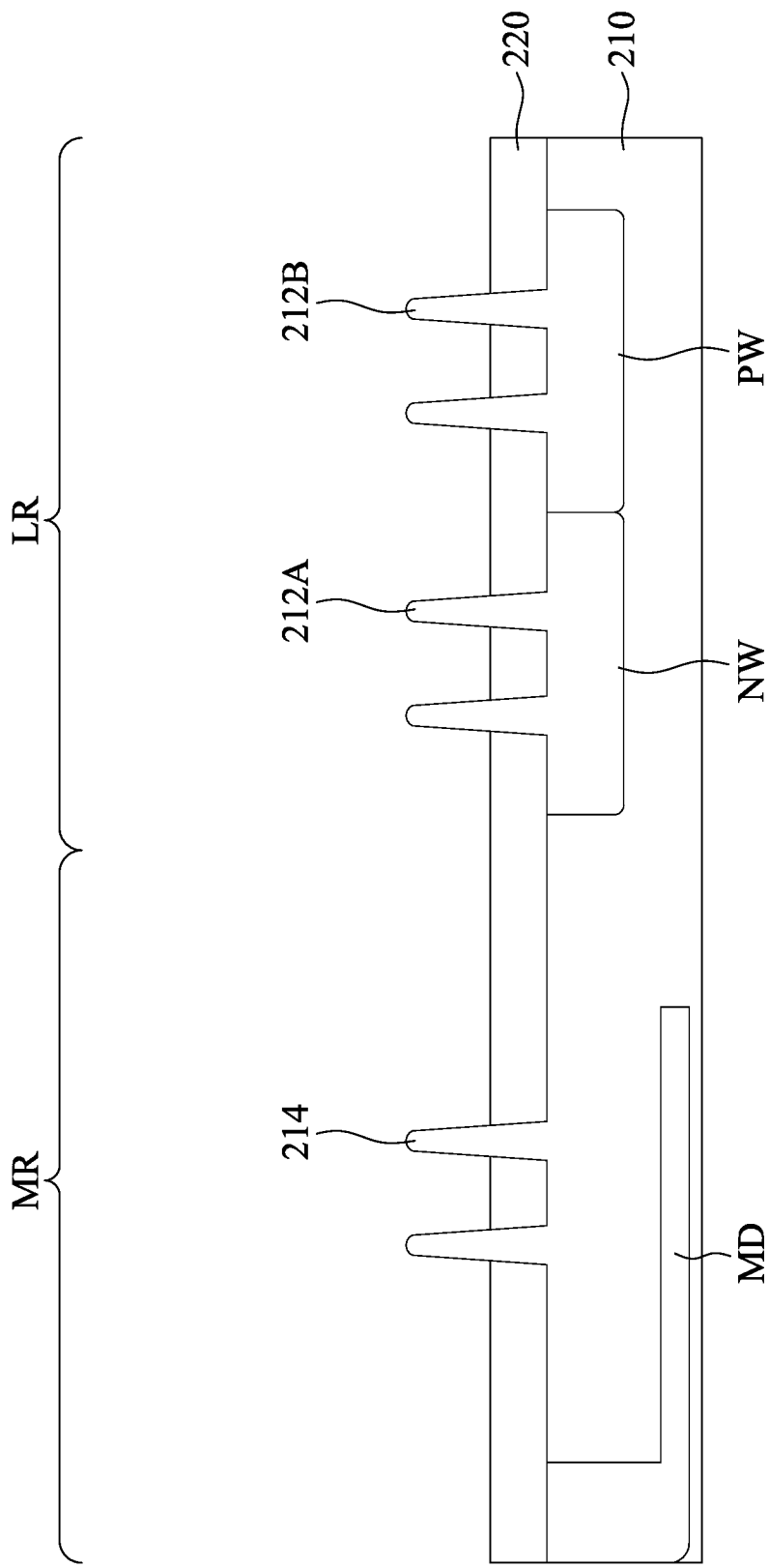

Reference is made to FIG. 24. The substrate 210 may be doped to form various doped region. In some embodiments, the doping process may use p-type dopants, such as boron or $BF_2$; n-type dopants, such as phosphorus or arsenic; or combinations thereof. For example, the fins 212A may be lightly doped with n-type dopants to form a n-type well region NW for a p-type transistor device. The fins 212B may be lightly doped with p-type dopants to form a p-type well region PW for an n-type transistor device. In the present embodiments, the substrate 210 in the memory region MR may be doped with p-type dopants to form a p-type heavily doped region MD. A dopant concentration of the p-type heavily doped region MD may be greater than that of the p-type well region PW, such that the p-type heavily doped region MD may serve as a conductive feature, acting as a bottom electrode for the devices in the memory region MR. In some other embodiments, the substrate 210 in the memory region MR may be doped with n-type dopants to form a n-type heavily doped region MD.

In some embodiments, the protruding portions 214 are not intentionally doped, for example, not having intentionally placed dopants, but rather having a doping resulting from process contaminants. For example, the protruding portions 214 are not intentional doped (NID) semiconductor materials and thus free from the dopants in the well regions PW and NW and the heavily doped region MD. Alternatively, in some other embodiments, the protruding portions 214 may be doped with a p-type or an n-type, and with a doping concentration lower than that of the well regions PW and NW and the heavily doped region MD.

Figure 25:
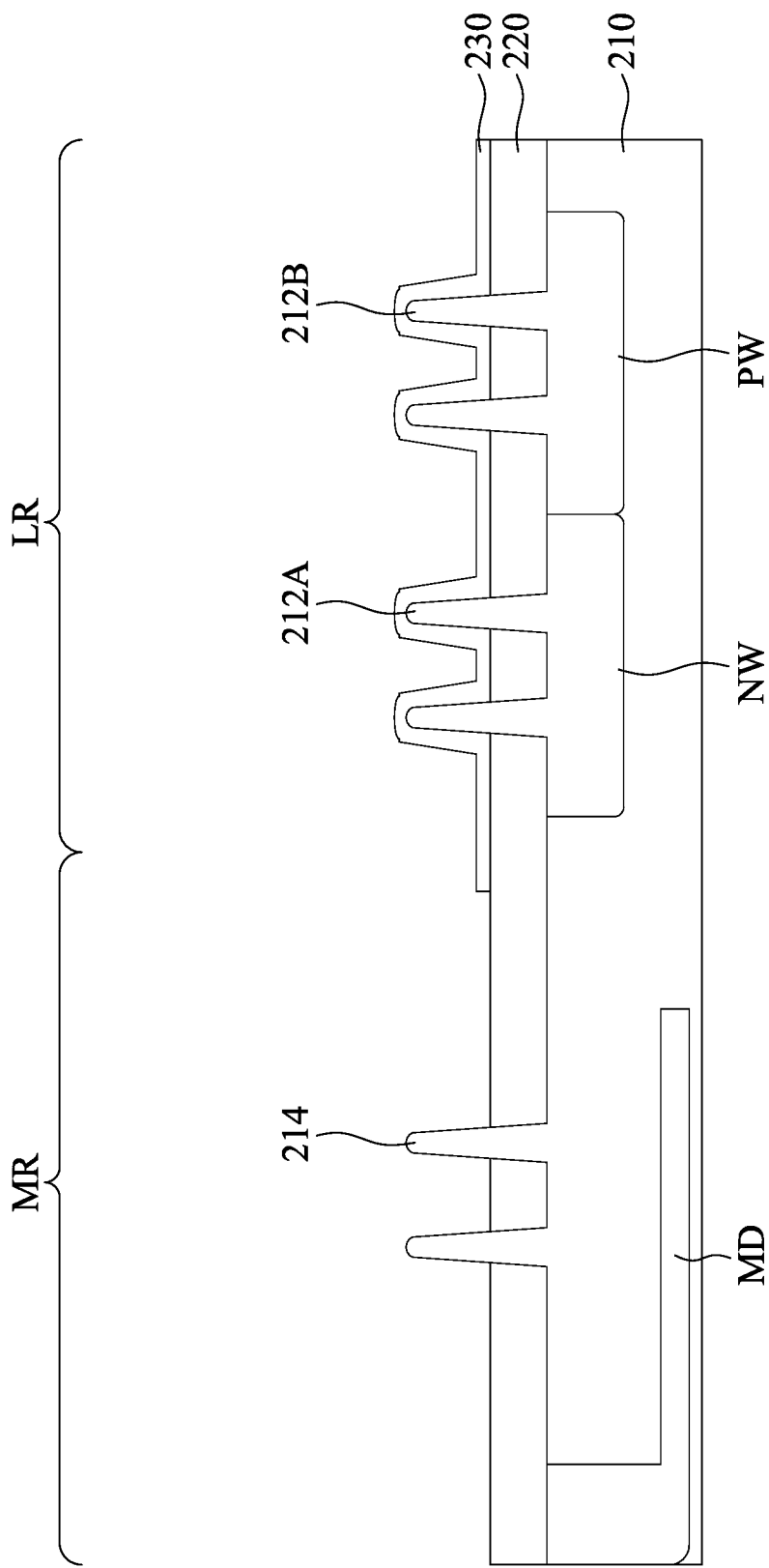

Reference is made to FIG. 25. A gate dielectric layer 230 is formed over the fins 212A and 212B. The gate dielectric layer 230 may be formed by a series of operations including film formation/deposition, photolithography patterning, and etching processes. The film formation/deposition process includes forming/depositing suitable dielectric martials (e.g., $SiO_2$) over the substrate 210, by suitable methods (e.g., thermal oxidation, CVD, PECVD, ALD, and/or the like). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 26:
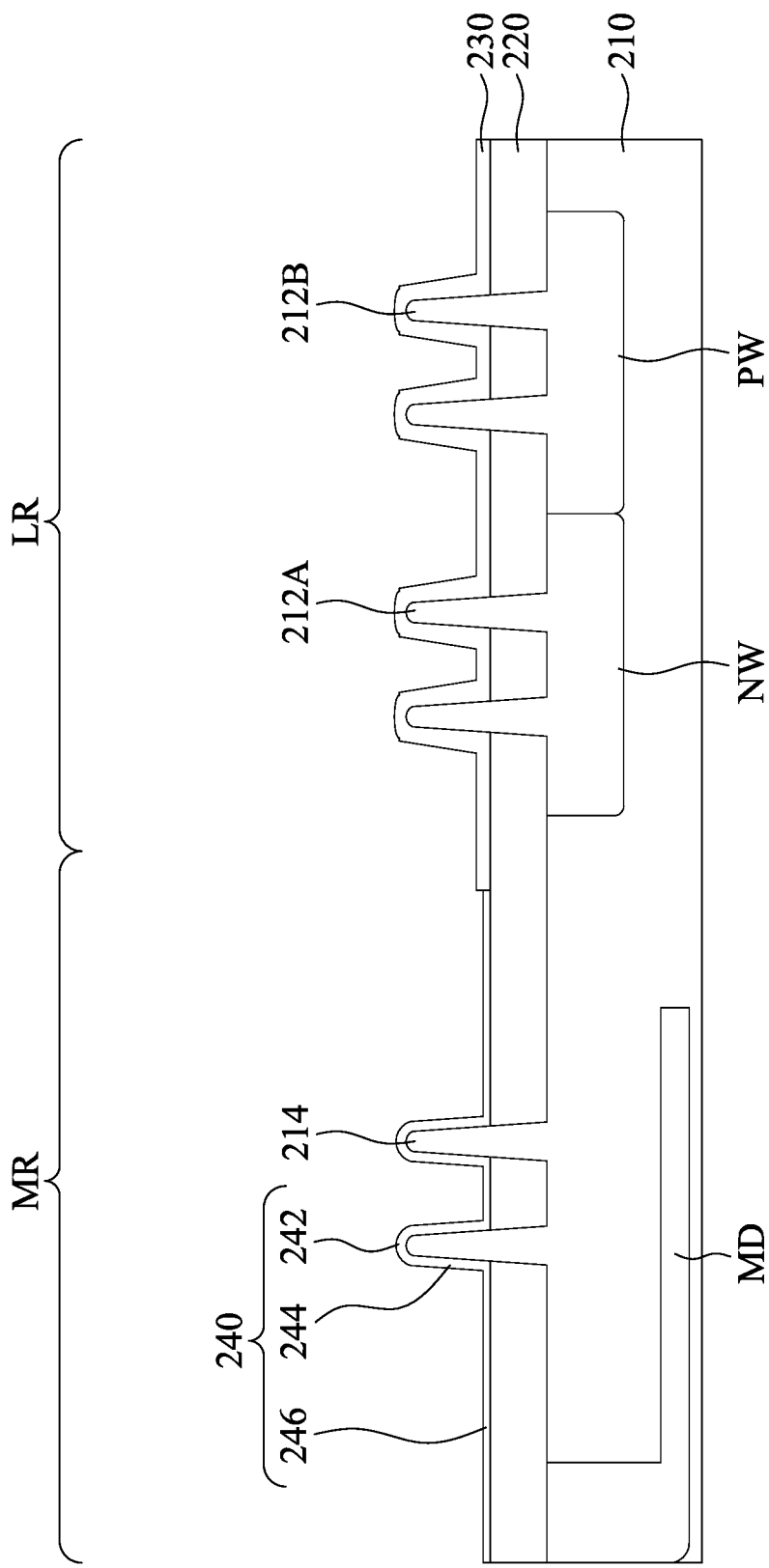

Reference is made to FIG. 26. A tunneling layer 240 is formed over the protruding portions 214. The tunneling layer 240 may be formed by suitable thermal oxidation process or deposition process. In some embodiments, a thickness of the tunneling layer 240 is less than a thickness of the gate dielectric layer 230, thereby achieving current tunneling effect. In some embodiments, the tunneling layer 240 may have portions 242 over top ends of the protruding portions 214, portions 244 over sidewalls of the protruding portions 214, and a portion 246 extending along a top surface of the isolation structures 220.

Figure 27:
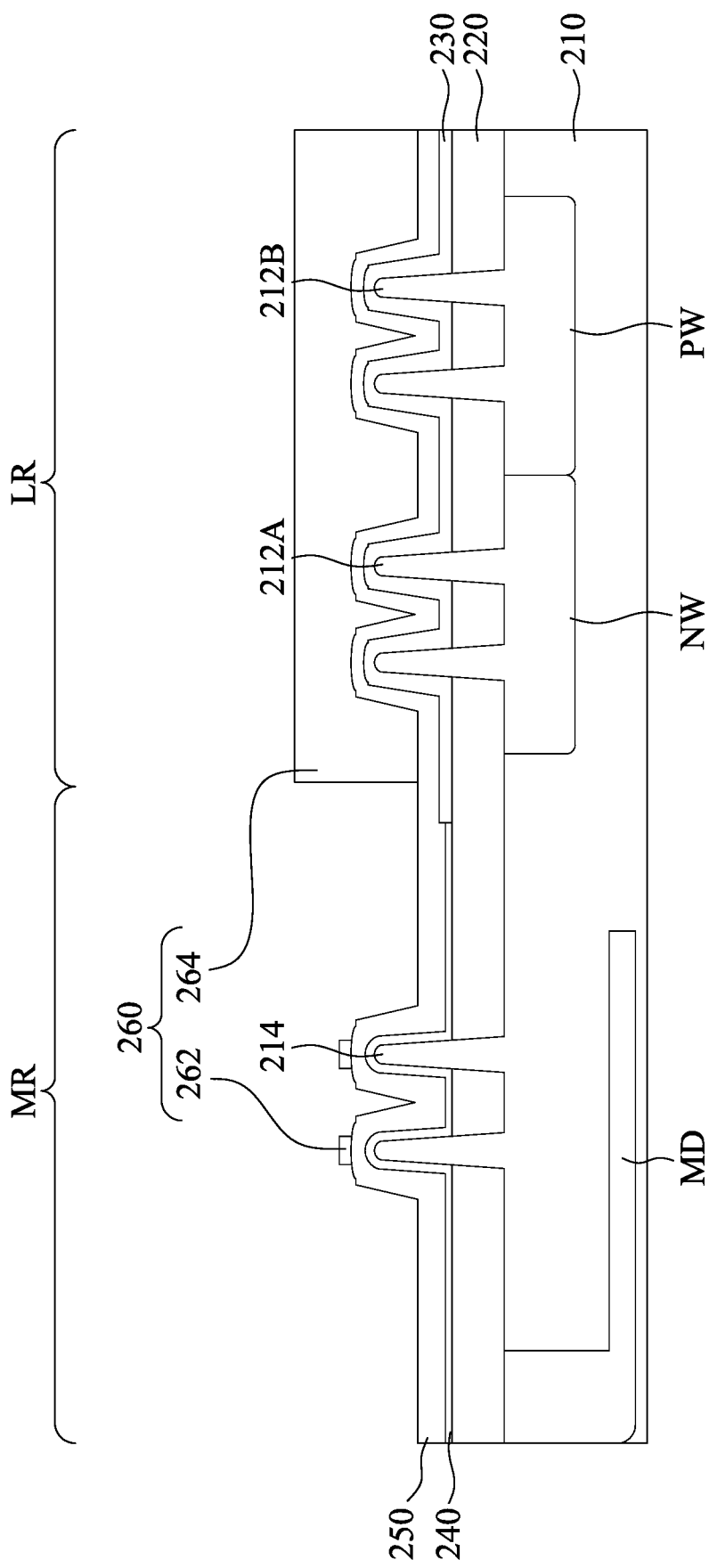

Reference is made to FIG. 27. An electrode layer 250 is deposited over the structure of FIG. 26. The electrode layer 250 may include suitable conductive martials, such as Cu, Al, W, Co, Ru, or other metals, combinations thereof, or multi-layers thereof. Alternatively, in some other embodiments, the electrode layer 250 may include doped polysilicon. The electrode layer 250 may be deposited by any suitable method, e.g., CVD, PECVD, PVD, ALD, and/or the like.

After the deposition of the electrode layer 250, a patterned mask 260 is formed over the electrode layer 250. The patterned mask 260 may have first masks 262 respectively over the protruding portions 214 and a second mask 264 covering the entire transistor region LR. The patterned mask 260 may be formed by photolithography patterning process. The photolithography patterning process may include photoresist coating (e.g., spin-on coating), soft baking, mask aligning, exposure, post-exposure baking, developing the photoresist, rinsing, drying (e.g., hard baking), and/or other applicable processes.

Figure 28A:
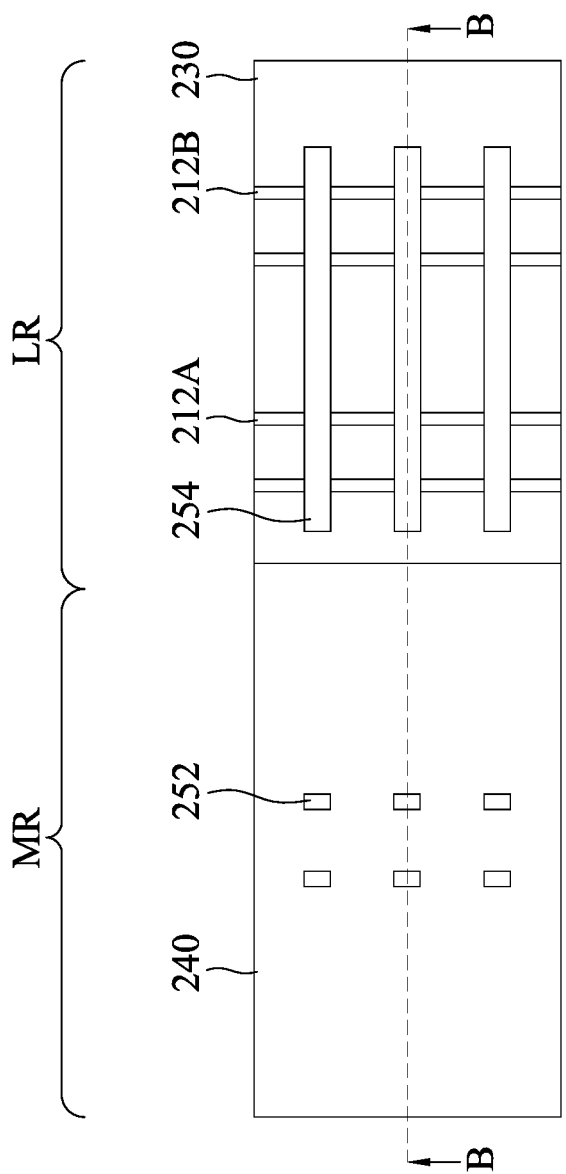
Figure 28B:
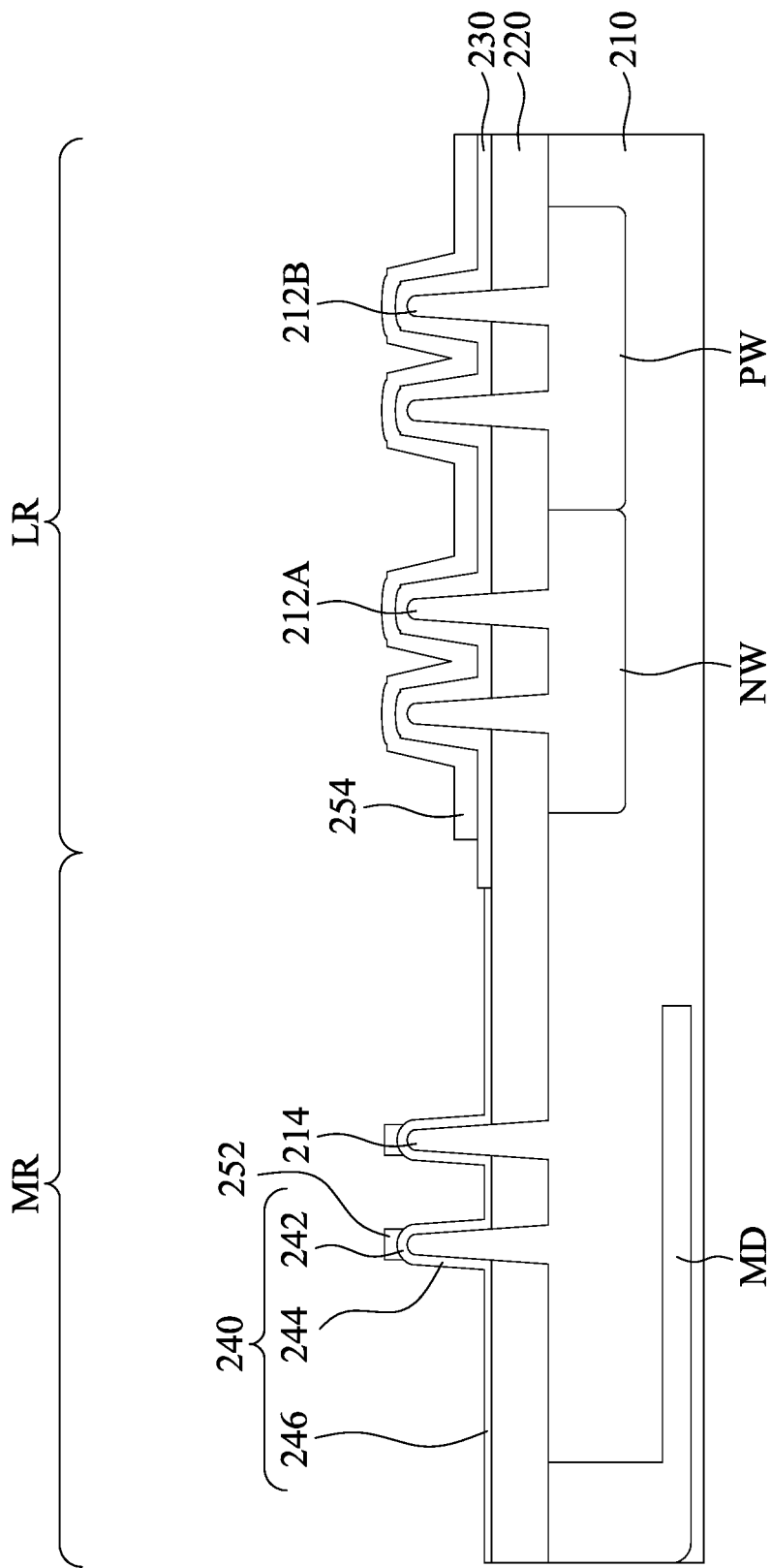

Reference is made to FIGS. 28A and 28B. FIG. 28A is a top view of an integrated circuit device at an intermediate stage of fabrication process according to some embodiments of the present disclosure. FIG. 28B is a cross-sectional view taken along line B-B in FIG. 28A. The electrode layer 250 (referring to FIG. 27) is patterned to form MIS top electrodes 252 and gate electrodes 254. The patterning process may include one or more etching processes using the patterned mask 260 (referring to FIG. 27) as etch mask. The etching processes may include dry etch, wet etch, or the combination thereof. After the patterning process, the patterned mask 260 (referring to FIG. 27) is removed by suitable stripping process. After the formation of the MIS top electrodes 252 and 254, the portions 244 and 246 of the gate dielectric layer 240 extend beyond the MIS top electrodes 252, while the portions of the gate dielectric layer 230 on sidewalls of the fins 212A/212B are in contact with the gate electrode 254.

Figure 29:
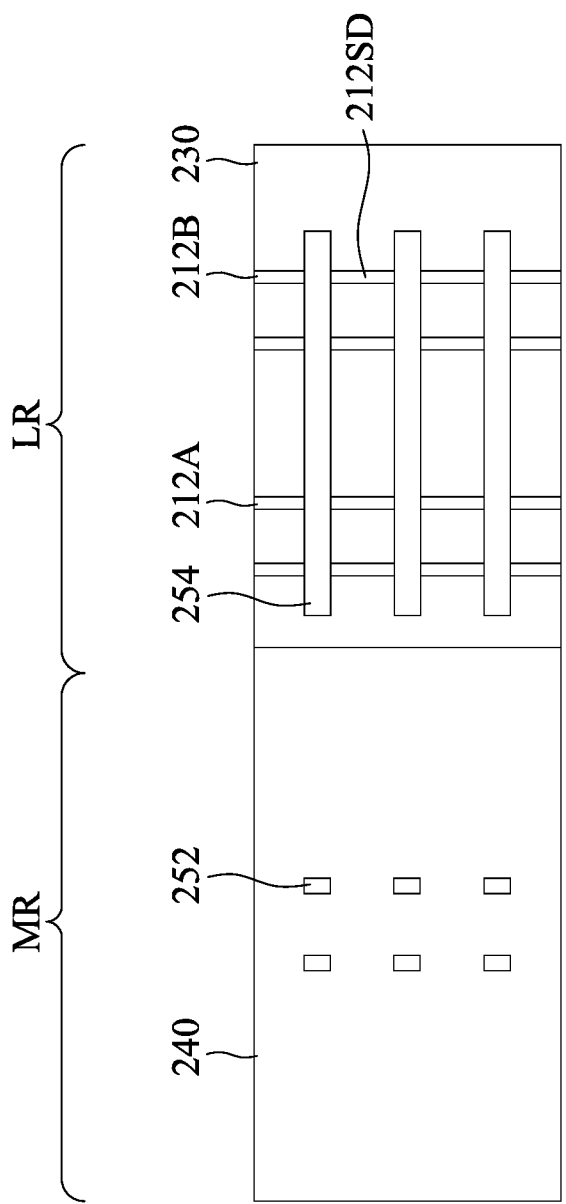

Reference is made to FIG. 29. FIG. 29 is a top view of an integrated circuit device at an intermediate stage of fabrication process according to some embodiments of the present disclosure. Source/drain regions 212SD are formed in the semiconductor fins 212A and 212B, respectively on opposite sides of the gate electrodes 254. In some embodiments, the source/drain regions 212SD may be formed by doping the semiconductor fins 212A and 212B with n-type or p-type dopants. A dopant concentration of the source/drain regions 212SD may be higher than that of the well regions NW and PW (referring to FIG. 28B). In some other embodiments, the source/drain regions 212SD may be epitaxy structures, and may also be referred to as epitaxy features. The epitaxy structures may be formed using one or more epitaxy or epitaxial (epi) processes, such that Si features, SiGe features, and/or other suitable features can be formed in a crystalline state on the semiconductor fins 212A and 212B. In some embodiments, the epitaxy structures may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP). The epitaxy structures may be in-situ doped. The doping species include p-type dopants, such as boron or $BF_2$; n-type dopants, such as phosphorus or arsenic; and/or other suitable dopants including combinations thereof. One or more annealing processes may be performed to activate the epitaxy structures.

Figure 30:
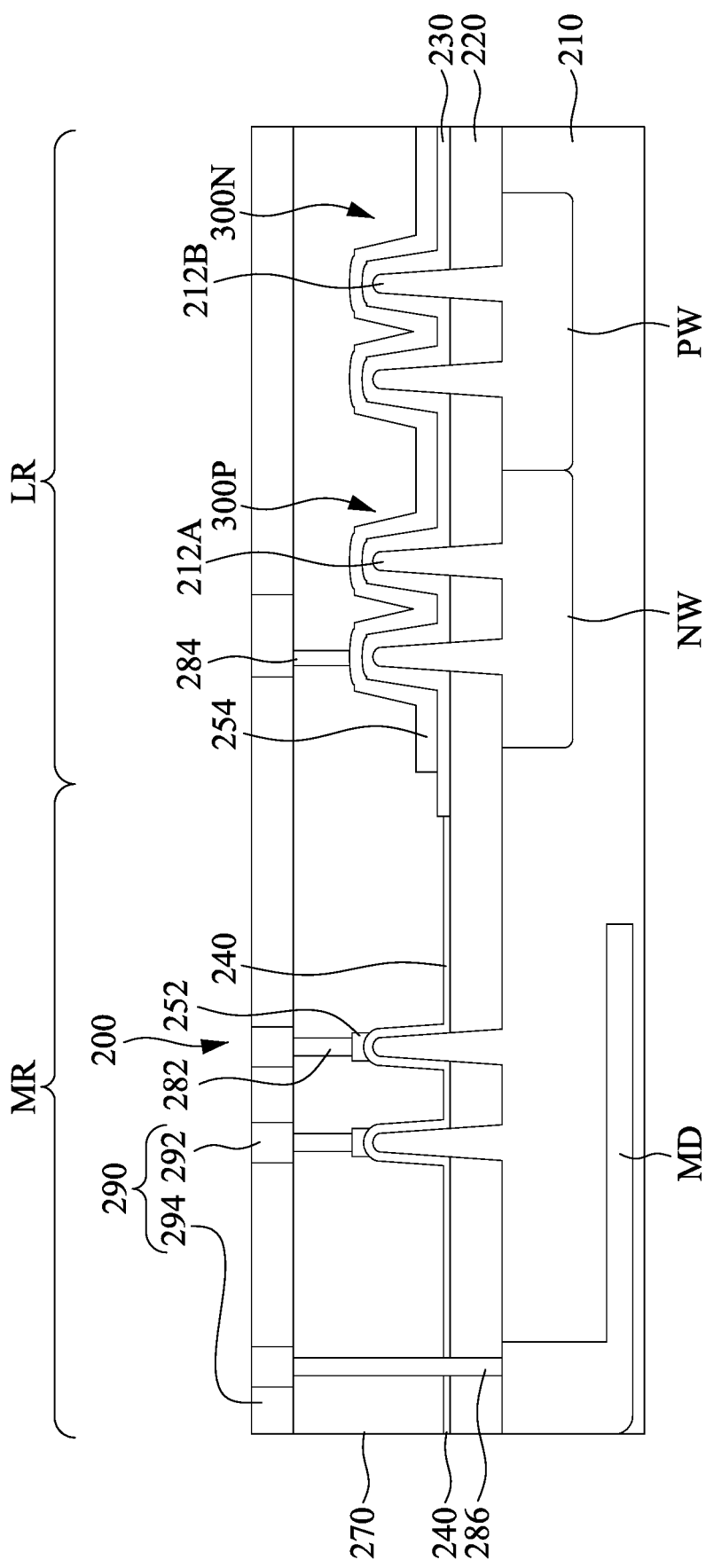

Reference is made to FIG. 30. After the source/drain regions 212SD are formed, an ILD 270 is formed over the substrate 210. The ILD 270 may include silicon oxide, oxynitride or other suitable materials. The ILD 270 includes a single layer or multiple layers. The ILD 270 can be formed by a suitable deposition technique, such as CVD. Contacts 282 and 284 are formed in the ILD 270, and respectively landing on the MIS top electrodes 252 and gate electrodes 254. Furthermore, a contact 286 may be formed in the ILD 270 and the isolation structures 220, landing over the doped region MD. Formation of the contacts 282-286 may include etching openings in the ILD 270 followed by filling the openings with conductive material. A CMP process may be performed to remove an excess portion of the conductive material out of the openings, thereby forming the contacts 282-286. Subsequently, one or more interconnect layers 290 may be formed over the ILD 270. Each of the interconnect layers 290 may include conductive features (e.g., metal line, metal via, or the combination thereof) 292 and an ILD 294 surrounding the conductive features.

Through the steps, a device 200, an n-type transistor device 300N, and a p-type transistor device 300P are formed. The device 200 may include a semiconductor layer (e.g., the protruding portion 214), a tunneling layer (e.g., the tunneling layer 240), a top electrode (e.g., the MIS top electrode 252), and a bottom electrode (e.g., the heavily doped region MD), is formed. The top electrode (e.g., the MIS top electrode 252) and the bottom electrode (e.g., the heavily doped region MD) are respectively at least partially directly above and below the semiconductor layer (e.g., the protruding portion 214). In some embodiments of the present disclosure, the tunneling layer 240 has a portion covering a sidewall of the protruding portion 214, such that a number of charge trapping sites is disposed at trench edge region, which in turn will enlarge current window of the device.

The transistor device 300N may include the fins 212B, the source/drain regions 212SD (referring to FIG. 29), a portion of the gate dielectric layer 230, and a portion of the gate electrode 254. The transistor device 300P may include the fins 212A, the source/drain regions 212SD (referring to FIG. 29), a portion of the gate dielectric layer 230, and a portion of the gate electrode 254. For each of the transistor devices 300N/300P, the gate dielectric layer 230 has a first portion over a top surface of the semiconductor fin 212B/212A and a second portion over a sidewall of the semiconductor fin 212B/212A, and the gate electrode 254 is in contact with the first and second portions of the gate dielectric layer 230.

In some embodiments of the present embodiments, the fabrication process of the trench-type MIS TD device 200 is compatible with the fabrication process of the transistor device 300N/300P. Furthermore, they may share the same fabrication steps, such as STI etching, STI formation, gate electrode deposition, and gate electrode patterning process, for saving masks and reducing costs. Other details of the present embodiments are similar to those illustrated above, and thereto not repeated herein.

FIGS. 31-36 illustrate a method for fabricating an integrated circuit device at various stages in accordance with some embodiments of the present disclosure. It is understood that additional steps may be provided before, during, and after the steps shown by FIGS. 31-36, and some of the steps described below can be replaced or eliminated for additional embodiments of the method. The order of the operations/processes may be interchangeable. The fabrication process of the present embodiments is similar to the integrated circuit device of FIGS. 23A-30, except that the trench-type MIS TD device 200 may not share the same fabrication steps with the transistor device 300N/300P.

Figure 31:
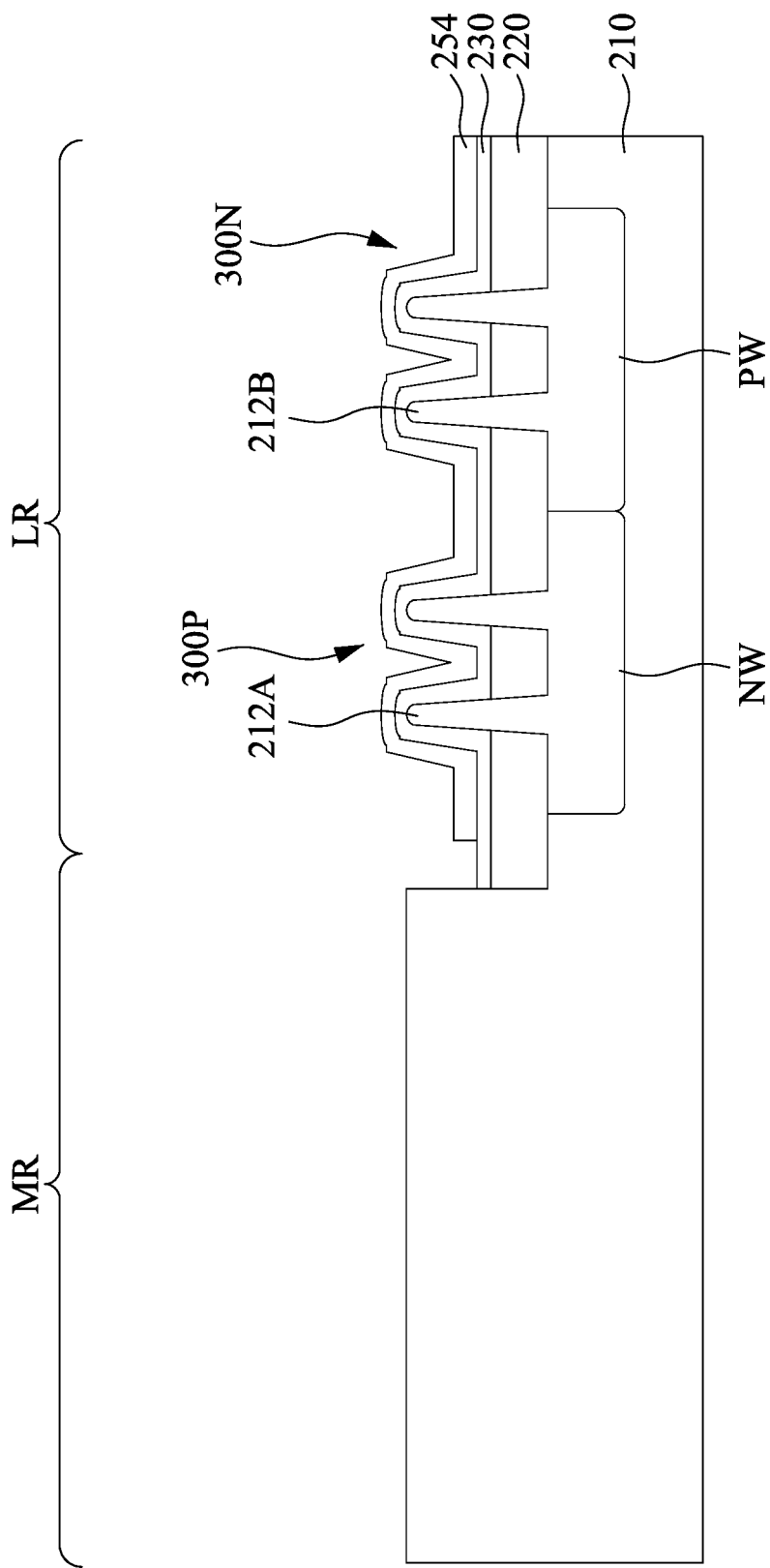
FIGS. 31-36 illustrate a method for fabricating an integrated circuit device at various stages in accordance with some embodiments of the present disclosure.

Reference is made to FIG. 31. An n-type transistor device 300N and a p-type transistor device 300P are formed over the transistor region LR of the substrate 210 first. Formation of these transistor devices is similar to those illustrated in FIGS. 23A-30, and thereto not repeated herein. In the present embodiments, the memory region MR of the substrate 210 may be protecting from being processed by coverage of suitable masks (e.g., photomasks formed by suitable lithography process) during the formation of these transistor devices.

Figure 32:
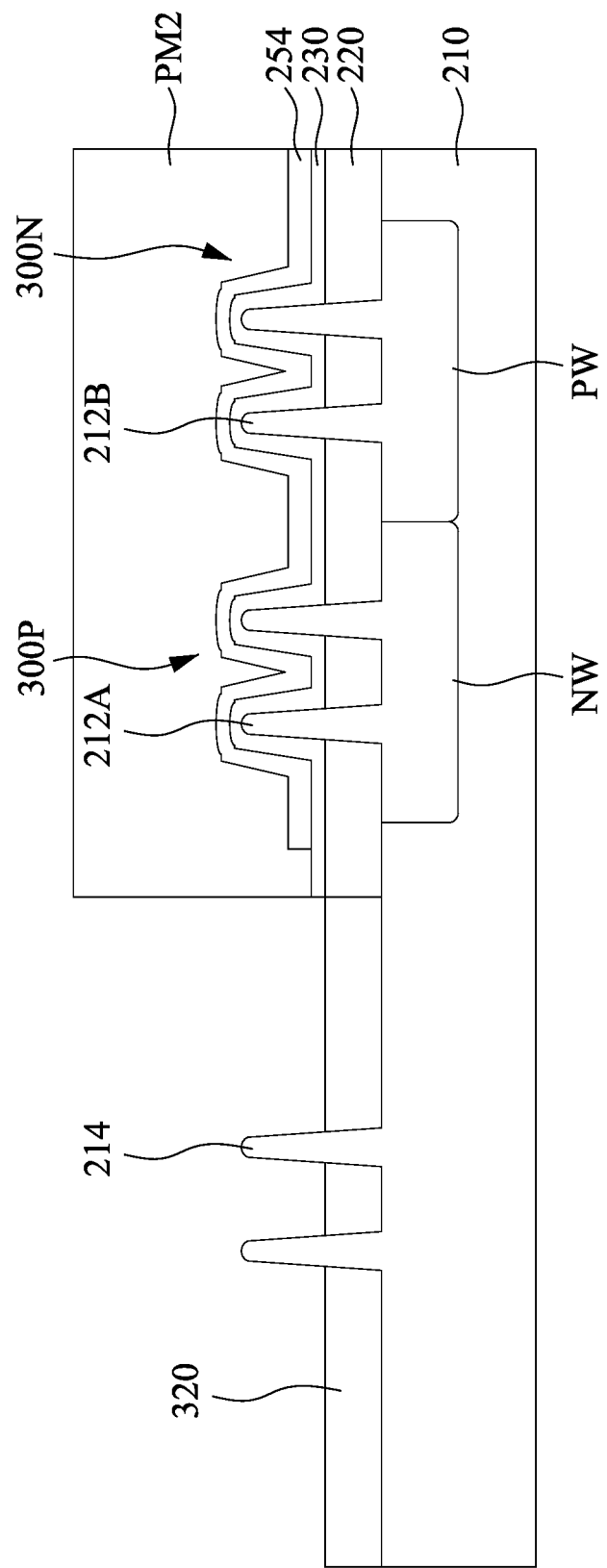

Reference is made to FIG. 32. Protruding portions 214 may be etched in the substrate 210 and then isolation structures 320 are formed over the substrate 210 and adjacent the protruding portions 214. The isolation structures 320, which act as a shallow trench isolation (STI) around the protruding portions 214 may be formed by chemical vapor deposition (CVD) techniques using tetra-ethyl-ortho-silicate (TEOS) and oxygen as a precursor, followed by planarization process and etching back process. The protruding portions 214 may have top surfaces higher than the isolation structures 320.

In the present embodiments, prior to the formation of the protruding portions 214 and the isolation structures 320, a patterned mask PM2 is formed over and covering the transistor region LR of the substrate 210. The patterned mask PM2 may be a photoresist mask formed by photolithography patterning process. The photolithography patterning process may include photoresist coating (e.g., spin-on coating), soft baking, mask aligning, exposure, post-exposure baking, developing the photoresist, rinsing, drying (e.g., hard baking), and/or other applicable processes. In some alternative embodiments, the patterned mask PM2 may be a tri-layer resist layer, for example, including a bottom layer (e.g., $C_xH_yO_z$), a middle layer (e.g., $SiC_xH_yO_z$), and a photoresist top layer. The patterned mask PM2 may protect the transistor region LR from the fabrication process for the memory devices.

Figure 33:
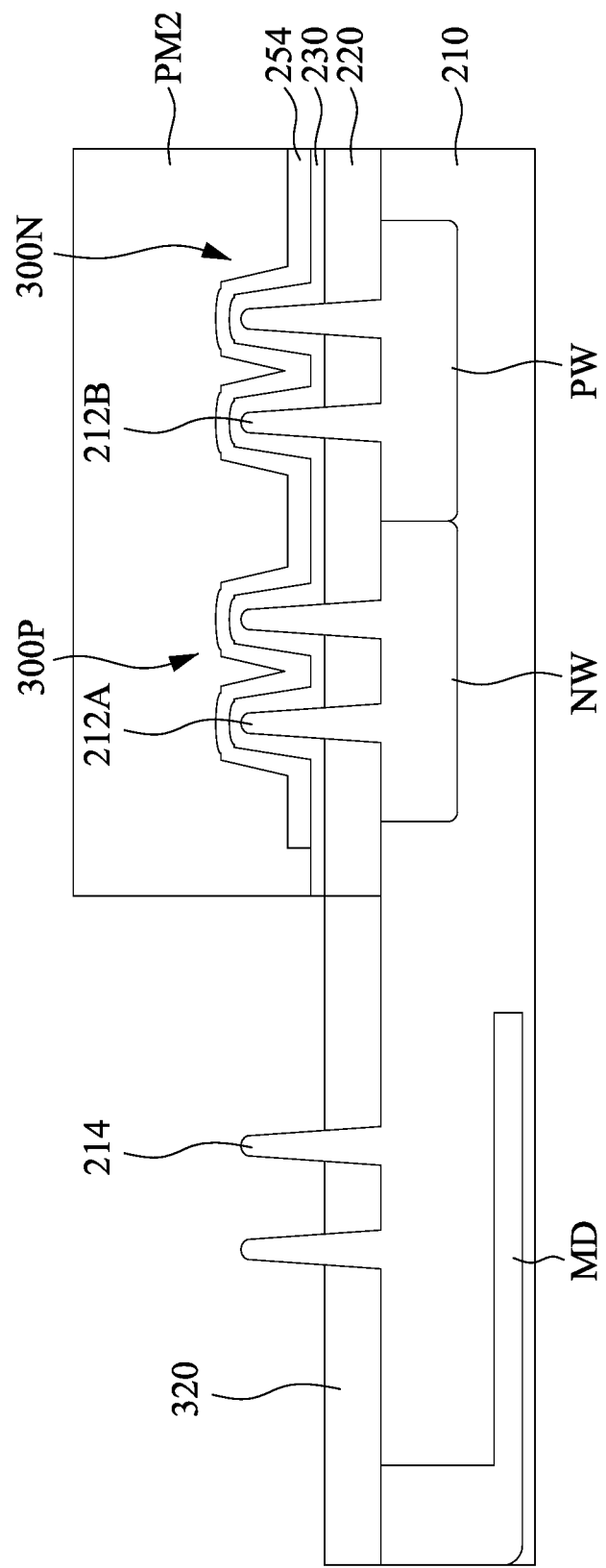

Reference is made to FIG. 33. The substrate 210 in the memory region MR may be doped with p-type dopants to form a p-type heavily doped region MD. A dopant concentration of the p-type heavily doped region MD may be higher than that of the p-type well region PW, such that the p-type heavily doped region MD may serve as a bottom electrode for the devices in the memory region MR. In some other embodiments, the substrate 210 in the memory region MR may be doped with n-type dopants to form a n-type heavily doped region MD. In some embodiments, the protruding portions 214 are not intentionally doped, for example, not having intentionally placed dopants, but rather having a doping resulting from process contaminants.

Figure 34:
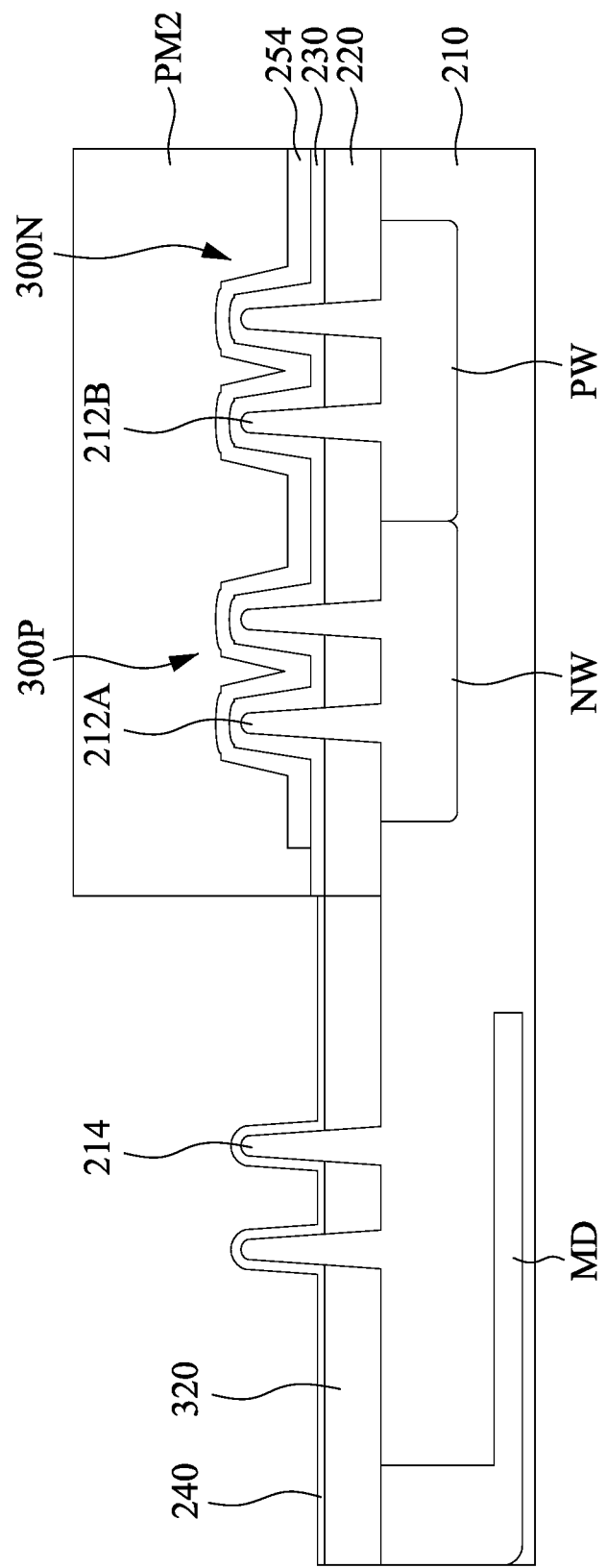

Reference is made to FIG. 34. A tunneling layer 240 is formed over the protruding portion 214. The tunneling layer 240 may be formed by suitable thermal oxidation process or deposition process. In some embodiments, a thickness of the tunneling layer 240 is less than a thickness of the gate dielectric layer 230, thereby achieving current tunneling effect.

Figure 35:
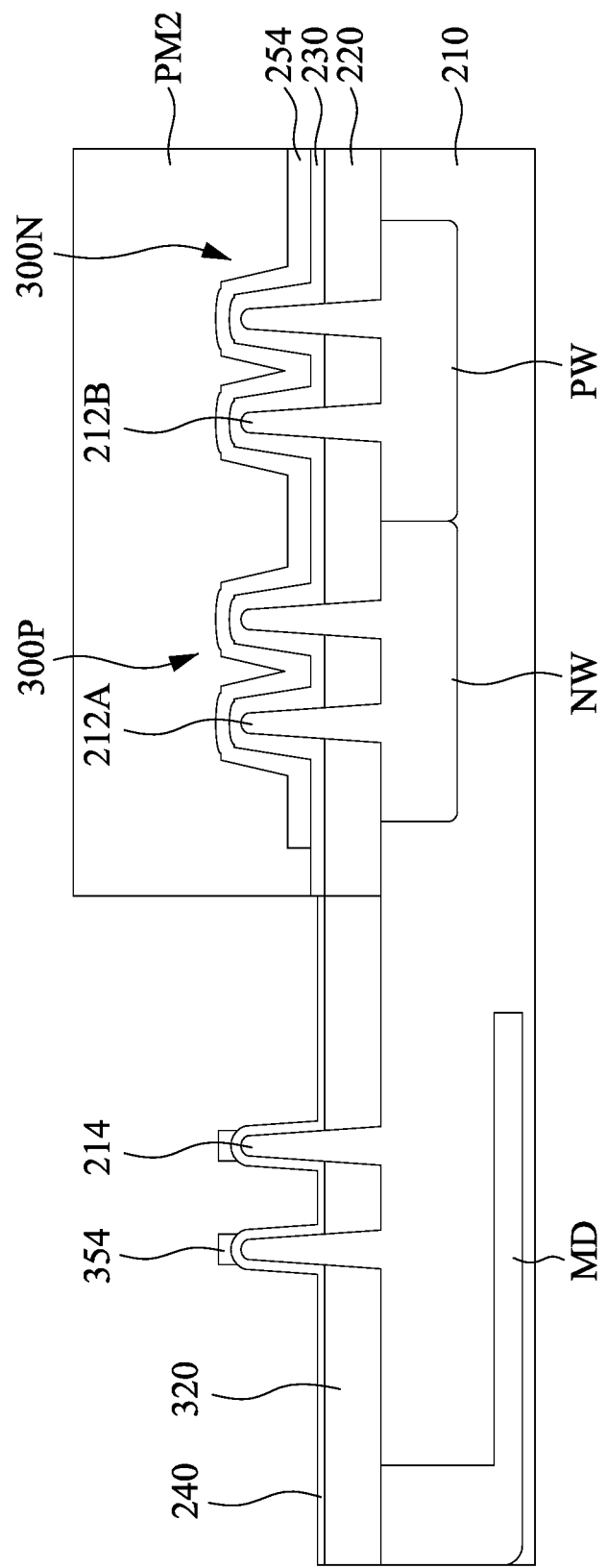

Reference is made to FIG. 35. Gate electrodes 354 are respectively formed over the protruding portions 214 and over the tunneling layer 240. Formation of the gate electrode 354 may include depositing a gate electrode layer over the structure of FIG. 34, and patterning the gate electrode layer into the gate electrodes 354. The patterning process may a photolithography process and an etching process. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 36:
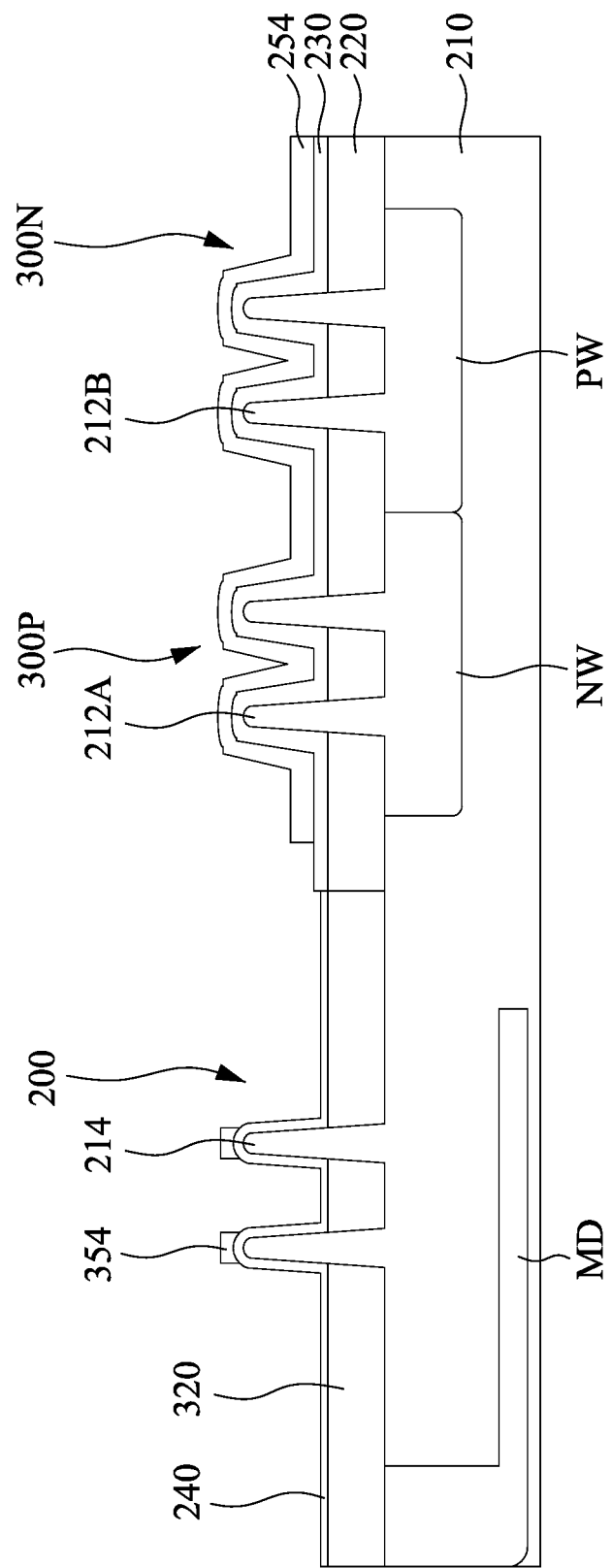

Reference is made to FIG. 36. The patterned mask PM2 is stripped off. In some embodiments, a plasma ashing or wet strip process is used to remove patterned mask PM1. In some embodiments, the plasma ashing process is followed by a wet dip in a sulfuric acid ($H_2SO_4$) solution to clean and remove remaining photoresist material. Suitable ILD, contacts, an interconnect layer (referring to FIG. 30) may then be formed over the structure of FIG. 36. Other details of the present embodiments are similar to those illustrated in FIGS. 23A-30, and therefore not repeated herein.

Figure 37A:
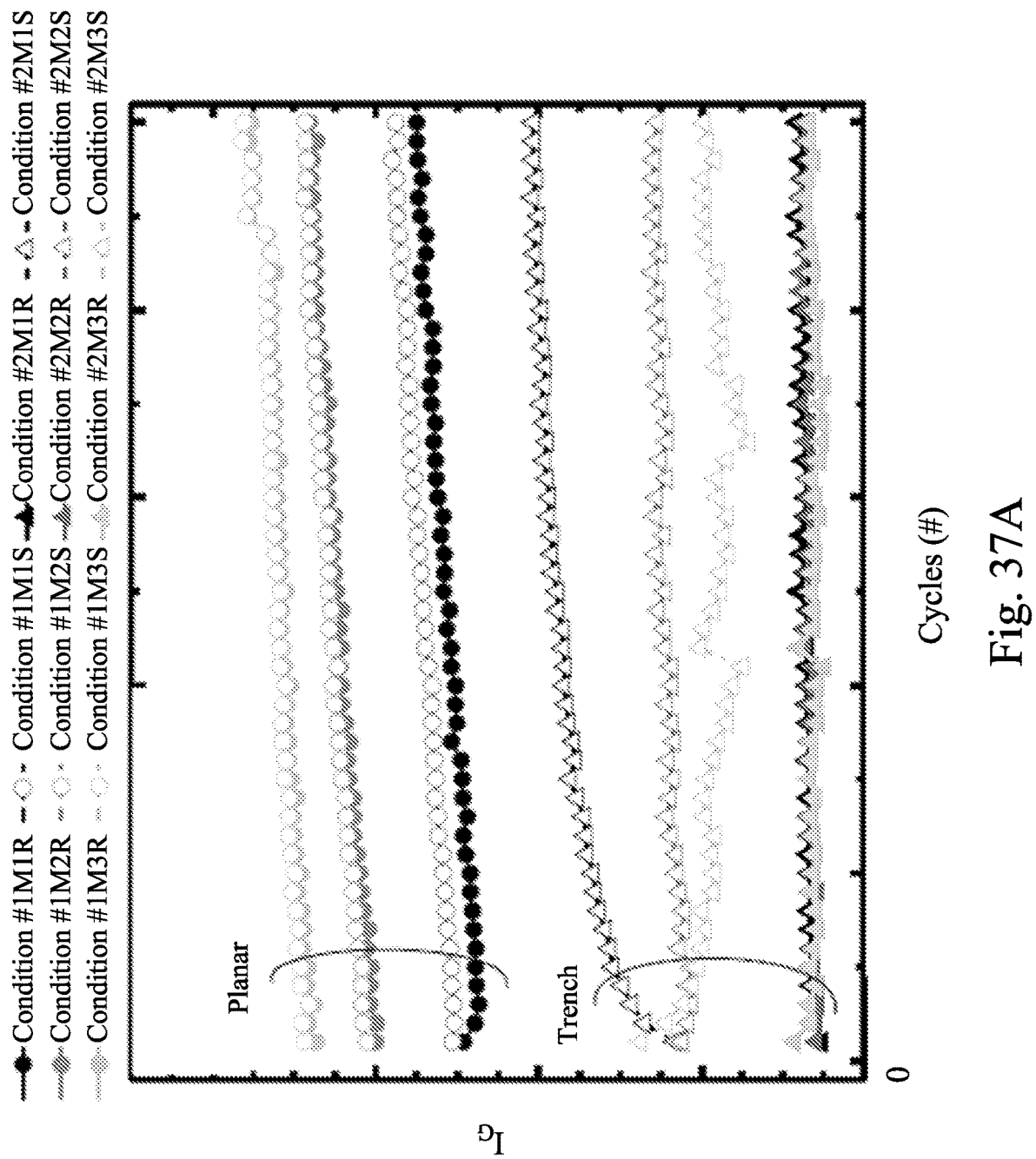
FIG. 37A is a plot of endurance characteristics of MIS TD devices under a multilevel stress-setting method in accordance with some embodiments of the present disclosure.

FIG. 37A is a plot of endurance characteristics of MIS TD devices under a multilevel stress-setting method in accordance with some embodiments of the present disclosure. In FIG. 37A, the number of cycles of reset and set operations is shown on the horizontal axis, a measured gate current is shown on the vertical axis. The solid dots indicate the currents read after the reset operation, and the hollow dots indicate the currents read after the set operation. These currents are read at a suitable reading voltage, such as 0.2 Volts. In FIG. 37A, the multilevel stress-setting method may include plural stress-setting steps (e.g., first to third stress-setting steps) that provides different stressing conditions. The stress conditions can be controlled by stress time and voltage. The stress-setting steps may be similar to the stress-setting method illustrated in FIG. 2, except that the stress conditions magnitude of voltages and time durations thereof are different.

In some embodiments, for multistate memory device, these stress-setting steps (e.g., first to third stress-setting steps) are designed to provide different setting conditions for achieving different levels of current after their set operation, and provide the same or similar resetting conditions for achieving the same level of current after their reset operation. For example, in some embodiments, the first to third stress-setting steps are designed with the same reset signal but different set signals. For example, reset voltages and reset time durations of the first to third stress-setting steps are the same, while set voltages and/or set time durations of the first to third stress-setting steps are different.

In FIG. 37A, triangular dots indicate a device having the trench structure, e.g., the aforementioned device 100. The conditions #2M1R and #2M1S shows the currents read respectively after cycles of reset and set operations in the first stress-setting step for the trench-type device. The conditions #2M2R and #2M2S shows the currents read respectively after cycles of reset and set operations in the second stress-setting step for the trench-type device. The conditions #2M3R and #2M3S shows the currents read respectively after cycles of reset and set operations in the third stress-setting step for the trench-type device.

In FIG. 37A, circle dots indicate a planar device without the trench structure. The conditions #1M1R and #1M1S shows the currents read respectively after cycles of reset and set operations in the first stress-setting step for the planar device. The conditions #1M2R and #1M2S shows the currents read respectively after cycles of reset and set operations in the second stress-setting step for the planar device. The conditions #1M3R and #1M3S shows the currents read respectively after cycles of reset and set operations in the third stress-setting step for the planar device.

In the present embodiments, the first stress-setting step may be designed for achieving a high level of current after its set operation; the second stress-setting step may be designed for achieving a middle level of current after its set operation; and the third stress-setting step may be designed for achieving a low level of current after its set operation. In some examples, the first and second stress-setting steps have the same set voltage, but a set time duration of the first stress-setting step is greater than the that of the second stress-setting step. The third stress-setting step has a set voltage less than that of the first and second stress-setting steps and a set time duration less than that of the second stress-setting step. For example, the set voltages of the first and second stress-setting steps may be in a range from about 0.8 Volts to about 1.2 voltages, and the set voltage of the third stress-setting steps may be in a range from about 0.4 Volts to about 0.6 voltages. The set time duration of the first to third stress-setting steps may be respectively in a range from about 5 seconds to about 15 seconds, a range from about 0.5 seconds to about 1.5 seconds, and a range from about 0.05 seconds to about 0.15 seconds. The reset signal of the reset operations may be similar to those illustrated in FIG. 2, and therefore not repeated herein.

Discussions are focused on the currents in the ends of the cycles for high endurance. Different levels of the currents are shown in the ends of the cycles. For the planar device (i.e., circle dots), the reset conditions are not stable. For example, the currents read after the reset operations (i.e., the conditions #1M1R, #1M2R, and #1M3R) get larger as the number of cycles increases. And, the currents read after the different reset operations (i.e., the conditions #1M1R, #1M2R, and #1M3R) are quite different from each other. Besides, the currents read after the reset operations (i.e., the conditions #1M1R, #1M2R, and #1M3R) are overlapping with or close to the currents read after the set operations (i.e., the conditions #1M1S, #1M2S, and #1M3S), which indicates a small current window.

For the trench-type device (i.e., triangular dots), the trench-type device (i.e., triangular dots) has a stable level of the currents read after the reset operations (i.e., the conditions #2M1R, #2M2R, and #2M3R). The currents read after the set operations (i.e., the conditions #2M1S, #2M2S, and #2M3S) are quite distinguished from the currents read after the reset operations (i.e., the conditions #2M1R, #2M2R, and #2M3R), which indicates a large current window. Furthermore, the currents read after the different set operations (i.e., the conditions #2M1S, #2M2S, and #2M3S) are quite distinguished from each other. It is inferred that the different stress conditions of the set operations of the first to third stress-setting steps may result in different amounts of the electrons recombined in the tunneling layer and the passivation layer, which results in the distinguished currents read after the different set operations (i.e., the conditions #2M1S, #2M2S, and #2M3S). Comparing the planar device (i.e., circle dots) with the trench-type device (i.e., triangular dots), the trench-type device (i.e., triangular dots) has four distinguished levels of the current, which include a stable reset current and three distinguished levels of the set current. This characteristic of the trench-type device (i.e., triangular dots) is beneficial for achieving a multistate memory device.

Figure 37B:
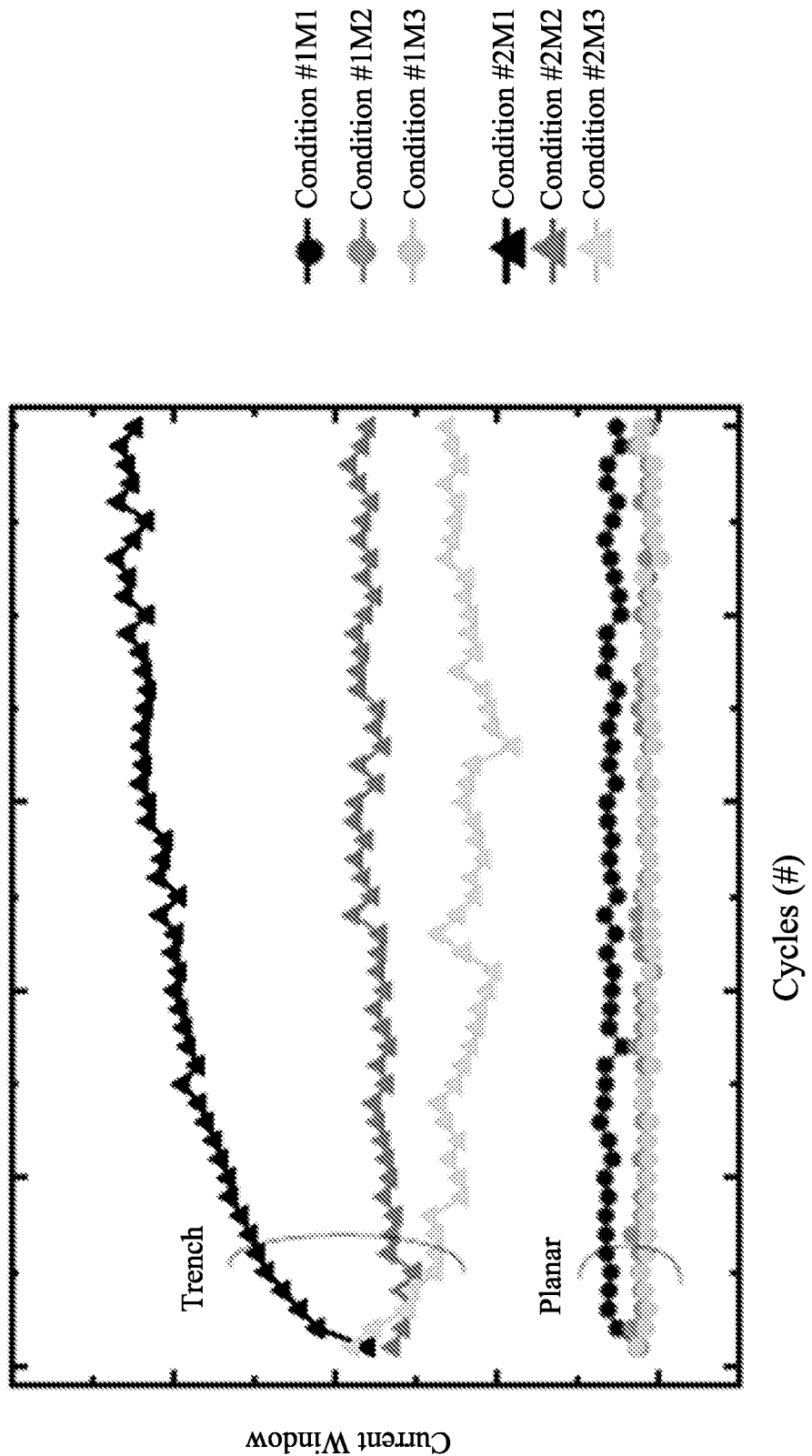
FIG. 37B is a plot of gate current window versus cycle of set and reset operations under the multilevel stress-setting method in FIG. 37A.

FIG. 37B is a plot of gate current window versus cycle of set and reset operations under the multilevel stress-setting method in FIG. 37A. In FIG. 37B, the number of cycles is shown on the horizontal axis, a current window is shown on the vertical axis. In FIG. 37B, the value of the current window is equal to a difference between a current read after the reset operation and a current read after the set operation in FIG. 37A. In FIG. 37B, triangular dots indicate a trench-type device, e.g., the aforementioned device 100. The conditions #2M1, #2M2, and #2M3 indicate the conditions respectively in the first to third stress-setting steps for the trench-type device. In FIG. 37B, circle dots indicate a planar device without the trench structure. The conditions #1M1, #1M2, and #1M3 indicate the conditions respectively in the first to third stress-setting steps for the planar device.

In FIG. 37B, the planar device (i.e., circle dots) has small current windows for first to third stress-setting steps. Comparing the planar device (i.e., circle dots) and the trench-type device (i.e., triangular dots), the trench-type device (i.e., triangular dots) has larger current windows for first to third stress-setting steps. Furthermore, the current windows of the trench-type device (i.e., triangular dots) in the first to third stress-setting steps are quite distinguished from each other, which is beneficial for achieving a multistate memory device.

Figure 38:
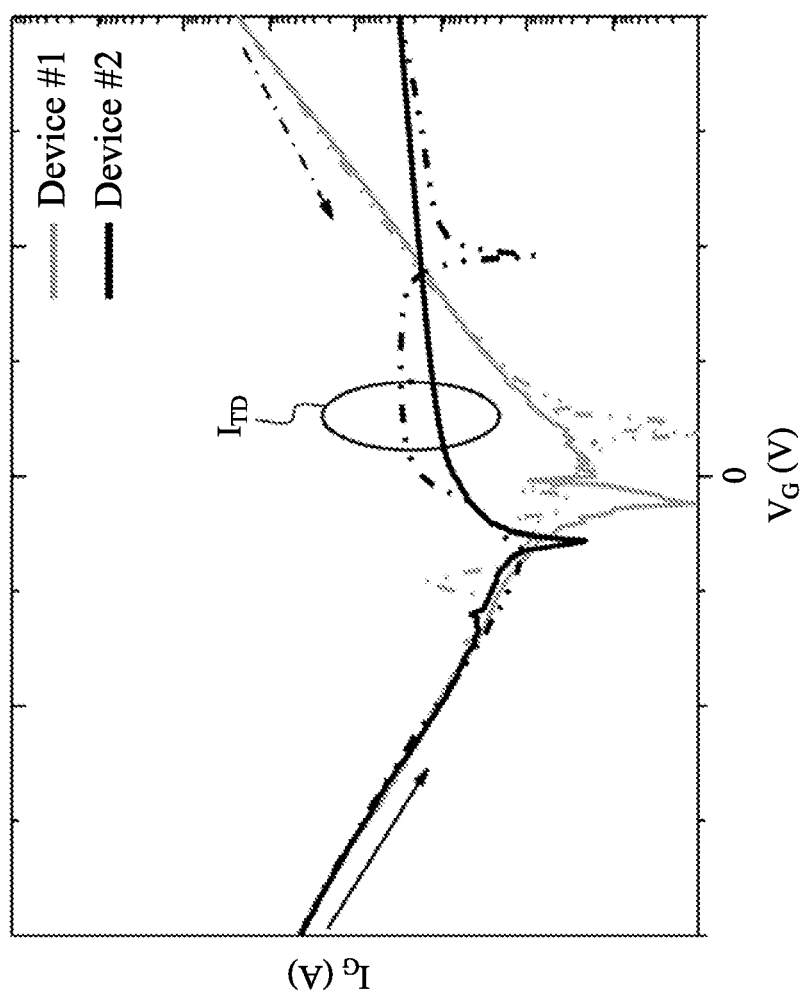
FIG. 38 illustrates a I-V characteristic of MIS TD devices under a sweep forward operation and a sweep backward operation.

FIG. 38 illustrates a I-V characteristic of MIS TD devices under a sweep forward operation and a sweep backward operation. In FIG. 38, the gate bias voltage VG is shown on the horizontal axis, a current is shown on the vertical axis. In FIG. 38, the solid line indicates the sweep forward operation, and the dashed line indicates the sweep backward operation. The device #1 corresponds to a planar device without the trench structure, and the device #2 corresponds to the trench-type device, e.g., the aforementioned device 100. In FIG. 38, for both device #1 and device #2, a thickness of the tunneling layer may be in a range from about 3 nanometers to about 4 nanometers.

In FIG. 38, at high voltage region, the device #2 has a smaller reverse bias steady-state current than that of the device #1. It is inferred that the planar device is in a stronger inversion condition, while the trench-type device shows a deep depletion phenomenon. This means that in planar devices, there are more minority carriers (electrons) supplied from the neighbor Si substrate outside the gate edge to the surface region (e.g., $SiO_2$/Si interface), which causes the device under stronger inversion. On contrary, for the trench-type device, since a part of the Si substrate outside the gate edge is removed, the supply number of minority carriers from Si substrate decreases accordingly. As a result, with less minority carriers supplement, the number of inversion charges in the trench-type device would not increase as gate voltage ($V_G$) becomes large.

In FIG. 38, at a low gate voltage region, a large hysteresis is observed. For example, at low gate voltage region (e.g., reading voltage), a difference is shown between a forward transient current (i.e., a transient current in sweep forward operation) and a backward transient current (i.e., a transient current in sweep backward operation). Compared with device #1 with the device #2, for the device #2, the difference between the forward transient current and the backward transient current, as indicated by the circle $I_{TD}$, is larger and more stable. It may be concluded that forming the trench structure in the device may result in larger transient currents at the low gate voltage region, and cause a displacement of transient currents. Besides, it is observed by experiments that a magnitude of the transient currents at zero voltage becomes larger as sweeping rate increases, which proves that the transient current behavior comes from displacement current because it is proportional to dV/dt.

Figure 39A:
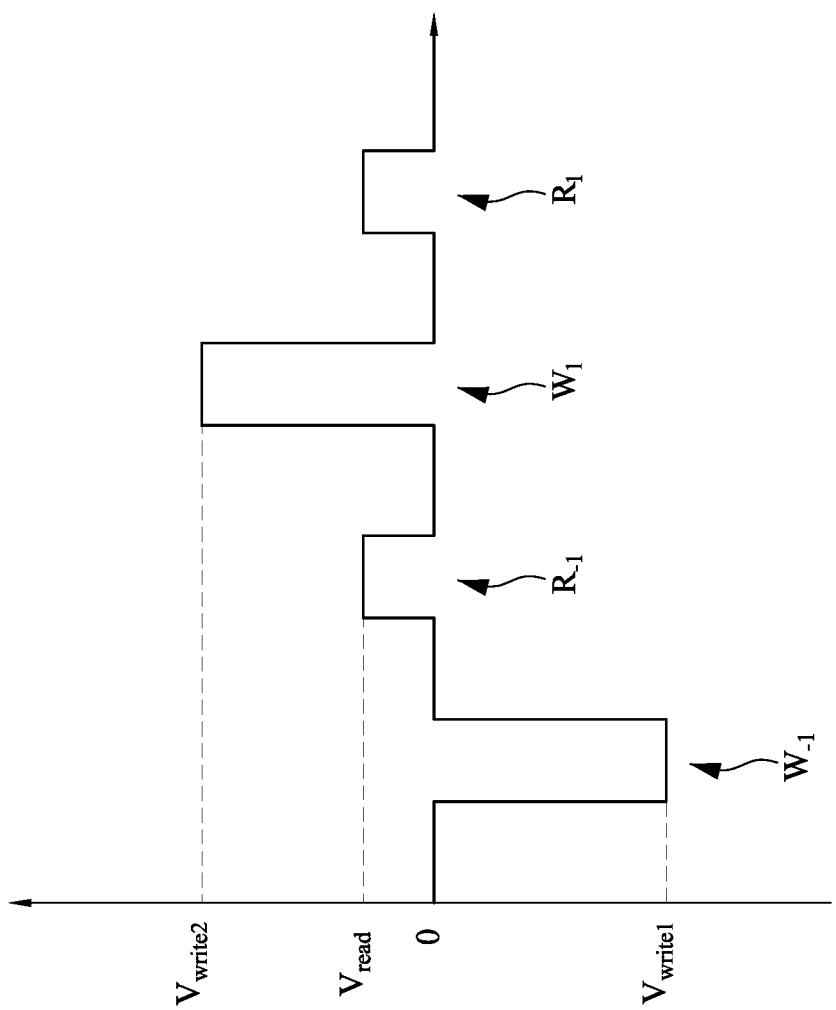
FIG. 39A is a timing diagram illustrating a switching-pulse-setting method of performing read operations and writing operations on a memory device in accordance with some embodiments of the present disclosure.

FIG. 39A is a timing diagram illustrating a switching-pulse-setting method of performing read operations and writing operations on a memory device in accordance with some embodiments of the present disclosure. In FIG. 39A, a time is shown on the horizontal axis, a gate bias voltage $V_G$ is shown on the vertical axis. Referring to FIGS. 1B and 39A, the controller circuit 900 in FIG. 1B may provide the signals in FIG. 39A to the gate electrode 132, and a reference potential (e.g., a ground potential) to the bottom electrode 170.

In FIG. 39A, the switching pulse setting method may include a first write operation $W_{-1}$, a read operation $R_{-1}$, a second write operation $W_1$, and a read operation $R_1$. The read operation $R_{-1}$ and $R_1$ are respectively performed after the two write operations $W_{-1}$ and $W_1$ for reading different state. The switching pulse setting method is used to create large change in voltage (dV/dt) for creating displacement current, and a two-state transient current can then be detected after switching pulse setting. The write signal of the first write operation $W_{-1}$ is represented as a write voltage $V_{write-1}$ for a first write time duration. The write signal of the second write operation $W_1$ is represented as a write voltage $V_{write-1}$ for a second write time duration. The write voltage $V_{write-1}$ may be in a negative value ranging from about $-1$ Volts to about $-3$ Volts. The write voltage $V_{write-1}$ may be a positive value ranging from about 1 Volts to about 3 Volts. The first and second write time durations may be in a range from about 0.1 milliseconds to about 10 milliseconds. In the read operations $R_{-1}$ and $R_{-1}$, the reading voltage $V_{read}$ may be in a range from about 0 Volts to about 0.15 Volts, such as 0.1 Volts.

In the present embodiments, as the switching-pulse-setting method may create large charges in voltage (dV/dt), the device used in this method is designed to have a thicker tunneling layer than that used in the stress-setting method (referring to FIG. 2). For example, a thickness of the tunneling layer of the device used in this method may be in a range from about 3 nanometers to about 4 nanometers.

Figure 39B:
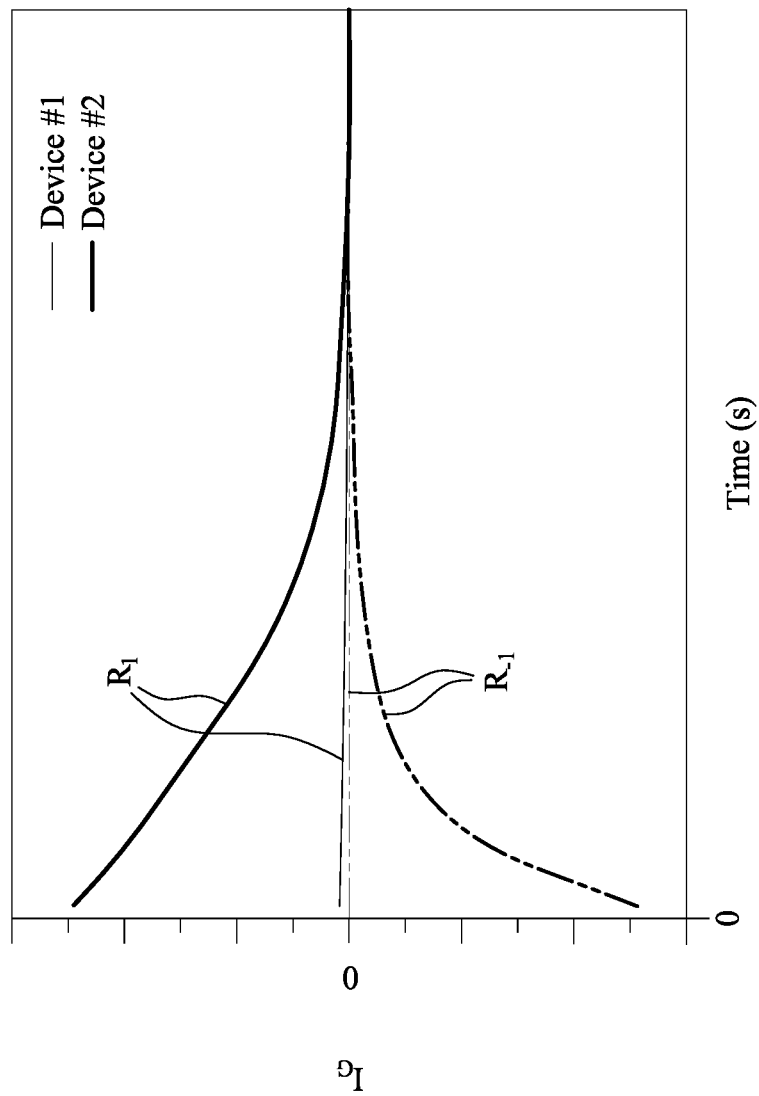
FIG. 39B is a plot of retention characteristics of the MIS TD devices under the switching-pulse-setting method in FIG. 39A.

FIG. 39B is a plot of retention characteristics of the MIS TD devices under the switching-pulse-setting method in FIG. 39A. In FIG. 39B, the read time is shown on the horizontal axis, a current is shown on the vertical axis. In FIG. 39B, the dashed line indicates the transient current read after the first writing operation $W_{-1}$ (referring to FIG. 39A), and the solid line indicates the transient current read after the second writing operation $W_1$ (referring to FIG. 39A). The reading voltage may be in a range from about 0 Volts to about 0.15 Volts, such as 0.1 Volts. The device #1 corresponds to a planar device without the trench structure, and the device #2 corresponds to the trench-type device, e.g., the aforementioned device 100.

In the case of the device #1, the two transient currents in the reading operations $R_1$ and $R_{-1}$ are close to each other and close to zero value. In the case of the device #2, a negative transient current is read in the reading operation $R_{-1}$ after the first writing operation $W_{-1}$ (referring to FIG. 39A), and a positive transient current is read in the reading operation $R_1$ after the second writing operation $W_1$ (referring to FIG. 39A). Compared device #2 with device #1, at time zero, a difference between the currents of device #2 is greater than that of the device #1, which indicates that the trench-type device may have a larger current window in the switching-pulse-setting method than the planar device does. Furthermore, the transient currents of the device #2 can last for a longer time after the read voltage is applied than the transient currents of the device #1 can, which indicates that the trench-type device has improved data retention ability.

Figure 39C:
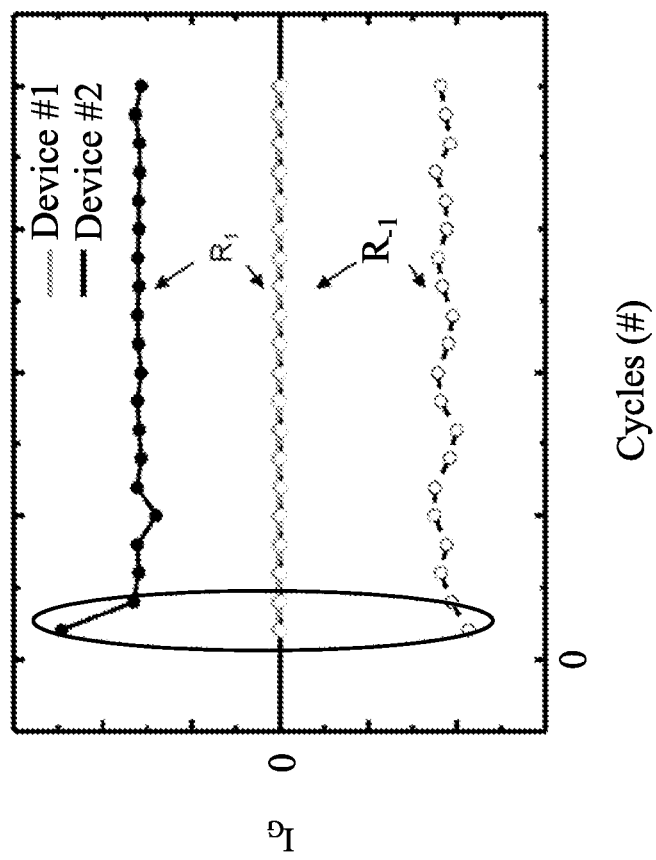
FIG. 39C is a plot of endurance characteristics of the MIS TD devices under the switching-pulse-setting method in FIG. 39A.
Figure 39D:
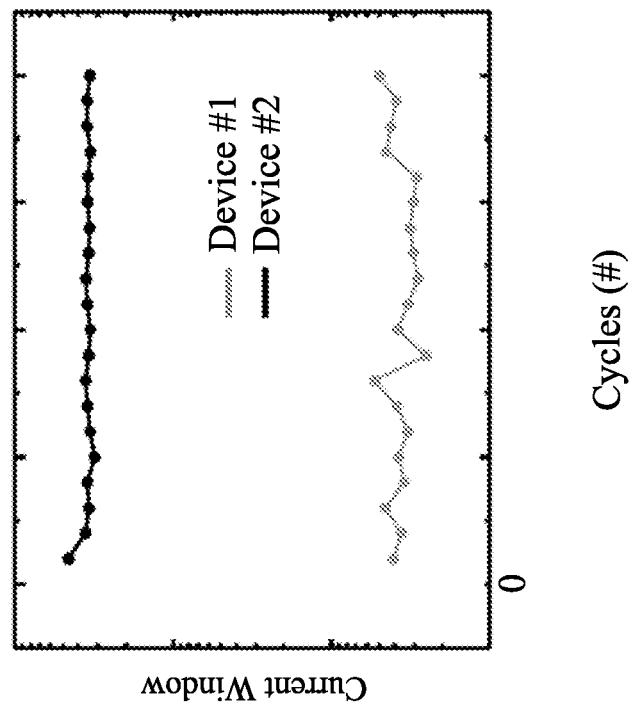
FIG. 39D is a plot of gate current window versus cycle of two write operations under the switching-pulse-setting method in FIG. 39A.

FIG. 39C is a plot of endurance characteristics of the MIS TD devices under the switching-pulse-setting method in FIG. 39A. FIG. 39D is a plot of gate current window versus cycle of the first and second write operations under the switching-pulse-setting method in FIG. 39A. In FIG. 39C, the number of cycles of the first and second write operations is shown on the horizontal axis, a read current is shown on the vertical axis. In FIG. 39D, the number of cycles of the first and second write operations is shown on the horizontal axis, a current window is shown on the vertical axis. In FIG. 39D, the value of the current window is equal to a difference between the current read in the read operation $R_{-1}$ and the current read in the read operation $R_1$ in FIG. 39C.

FIG. 39C shows that device #2 have a larger magnitude of current than that of the device #1. FIG. 39D shows that device #2 have a larger current window than that of the device #1. For example, the larger current window of the device #2 is greater than that of device #1 by at least one orders, e.g., two orders. The trench structure may cause uneven distribution of the depletion region below the device. When quickly switching from the write operation $W_1/W_{-1}$ to read operation $R_1/R_{-1}$, the depletion region adjacent the trench edge may stretch in a different speed than the depletion region adjacent a device center stretches. A displacement current due to the stretching of the depletion region can be read.

Comparing the switching-pulse-setting method in FIG. 39A and the stress-setting method in FIG. 2, the stress-setting method is more advantageous for having a large current window (>200 pA) than the switching-pulse-setting method. Furthermore, the switching-pulse-setting method is more advantageous for having a short write time (≤1 ms) than the stress-setting method, thereby quickly change to a reading operation.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by forming the trench at the edge of the gate region, an approximate ten times larger current window can be achieved compared with a planar device. Another advantage is that the current window can be controlled by applying different stress conditions, which in turn will achieve multi-level states function. Still another advantage is that the semiconductor device not only achieves a larger and controllable current memory window but also uses less set/reset time.

According to some embodiments of the present disclosure, an integrated circuit device includes a semiconductor structure, a tunneling layer, a top electrode, a passivation layer, and a conductive feature. The semiconductor structure has a base portion and a protruding portion over a top surface of the base portion. The tunneling layer is over a top surface of the protruding portion of the semiconductor structure. The top electrode is over the tunneling layer. The passivation layer is over a sidewall of the protruding portion of the semiconductor structure. The conductive feature is directly below the protruding portion of the semiconductor structure.

According to some embodiments of the present disclosure, an integrated circuit device includes a semiconductor substrate, a tunneling layer, a top electrode, and a conductive feature. The semiconductor substrate has a base portion and a protruding portion over a top surface of the base portion. The tunneling layer has a first portion over a top surface of the protruding portion of the semiconductor substrate and a second portion over a sidewall of the protruding portion of the semiconductor substrate. The top electrode is over the first portion of the tunneling layer, and the second portion of the tunneling layer extend beyond the top electrode. The conductive feature is below the protruding portion of the semiconductor substrate.

According to some embodiments of the present disclosure, a method for fabricating an integrated circuit device is provided. The method includes etching at least one trench in a semiconductor substrate to form a protruding portion of the semiconductor substrate; forming a tunneling layer over a top surface and a sidewall of the protruding portion; and forming a top electrode over a first portion of the tunneling layer over the top surface of the protruding portion, wherein a second portion of the tunneling layer extends beyond the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, comprising:
    etching at least one trench in a semiconductor substrate to form a protruding portion of the semiconductor substrate, wherein the protruding portion has a top surface and a sidewall extending downwards from the top surface of the protruding portion and surrounding the top surface of the protruding portion;
    forming an isolation structure surrounding the protruding portion of the semiconductor substrate;
    forming a doped semiconductor region in the semiconductor substrate, wherein the doped semiconductor region is directly below the protruding portion, and has a higher dopant concentration than the protruding portion of the semiconductor substrate;
    forming a tunneling layer over the top surface and the sidewall of the protruding portion;
    forming a top electrode over a first portion, of the tunneling layer over the top surface of the protruding portion, the top electrode vertically overlapping an entirety of the top surface of the protruding portion and a portion of the sidewall of the protruding portion adjoining the top surface of the protruding portion, wherein a second portion of the tunneling layer extends beyond a sidewall of the top electrode, and at least a part of the second portion of the tunneling layer has a top surface lower than a top surface of the first portion of the tunneling layer; and
    forming a contact extending through the isolation structure and electrically connected with the doped semiconductor region.

2. The method of claim 1,
    wherein the top surface of the protruding portion of the semiconductor substrate is higher than the isolation structure.

3. The method of claim 1, wherein etching the at least one trench in the semiconductor substrate comprises:
    etching a plurality of the trenches in the semiconductor substrate to form a semiconductor fin, wherein a length of the semiconductor fin is different from a length of the protruding portion of the semiconductor substrate when viewed from above.

4. The method of claim 1, wherein the doped semiconductor region has p-type dopants.

5. A method for fabricating an integrated circuit device, comprising:
    patterning a semiconductor substrate to form at least one protruding portion and at least one semiconductor fin;
    forming a tunneling layer over the at least one protruding portion;

forming a gate dielectric layer over the at least one semiconductor fin;

depositing an electrode layer over the tunneling layer and the gate dielectric layer;

patterning the electrode layer into at least one top electrode over the tunneling layer and a gate electrode over the gate dielectric layer, wherein the tunneling layer extends beyond opposite sidewalls of the top electrode, and one of the sidewalls of the top electrode is vertically overlapping with a sidewall of the protruding portion; and forming an interlayer dielectric layer over the semiconductor substrate, wherein the interlayer dielectric layer is in contact with an interface between the tunneling layer and the gate dielectric layer.

6. The method of claim 5, wherein a bottommost portion of a bottom surface of the at least one top electrode is higher than a bottommost portion of a bottom surface of the gate electrode.

7. The method of claim 5, wherein a thickness of the tunneling layer is less than a thickness of the gate dielectric layer.

8. The method of claim 5, wherein patterning the electrode layer is performed such that a plurality of the top electrodes are respectively over a plurality of the protruding portions.

9. The method of claim 5, wherein patterning the electrode layer is performed such that the gate electrode is over a plurality of the semiconductor fins.

10. The method of claim 5, further comprising:
forming an isolation structure surrounding the protruding portion and the semiconductor fin, wherein top surfaces of the protruding portion and the semiconductor fin are higher than a top surface of the isolation structure.

11. The method of claim 5, further comprising:
doping a first one of a plurality of the semiconductor fins with a first dopant; and
doping a second one of a plurality of the semiconductor fins with a second dopant having a conductive type opposite to that of the first dopant, wherein the protruding portion is free from the first dopant and the second dopant.

12. The method of claim 5, further comprising:
forming at least one first contact over the at least one top electrode; and
forming a second contact over the gate electrode.

13. The method of claim 12, wherein forming the at least one first contact is performed such that a plurality of the first contacts are respectively over a plurality of the top electrodes.

14. A method for fabricating an integrated circuit device, comprising:
forming a protruding portion over a semiconductor substrate;
forming an isolation structure surrounding a bottom portion of the protruding portion, wherein a top portion of the protruding portion is higher than a top surface of the isolation structure;
forming a tunneling layer over the isolation structure and surrounding the top portion of the protruding portion;
depositing an electrode layer over the tunneling layer; and
patterning the electrode layer into a top electrode over the protruding portion, wherein a sidewall of the top electrode is vertically overlapping with a sidewall of the protruding portion, a vertical portion of the tunneling layer surrounding the top portion of the protruding portion and a lateral portion of the tunneling layer extending along the isolation structure are exposed as a result of patterning the electrode layer into the top electrode, and the vertical portion of the tunneling layer is in contact with the sidewall of the protruding portion.

15. The method of claim 14, further comprising:
forming a semiconductor fin over the semiconductor substrate; and
forming a gate dielectric layer over the isolation structure and surrounding a top portion of the semiconductor fin higher than the top surface of the isolation structure, wherein patterning the electrode layer is performed such that the electrode layer is patterned into the top electrode and a gate electrode over the gate dielectric layer and the semiconductor fin.

16. The method of claim 15, wherein a portion of the gate dielectric layer surrounding the top portion of the semiconductor fin is covered by the gate electrode after patterning the electrode layer.

17. The method of claim 15, wherein forming the gate dielectric layer is performed prior to forming the tunneling layer.

18. The method of claim 15, wherein an end of the tunneling layer is in contact with an end of the gate dielectric layer.

19. The method of claim 14, further comprising:
forming an interlayer dielectric layer over and in contact with the tunneling layer and the top electrode.

20. The method of claim 19, further comprising:
forming a contact in the interlayer dielectric layer and in contact with the top electrode.

* * * * *